(12) United States Patent
Alexander

US010083702B2

(10) Patent No.: US 10,083,702 B2
(45) Date of Patent: Sep. 25, 2018

(54) ENHANCING PERCEPTION OF FREQUENCY-LOWERED SPEECH

(71) Applicant: Purdue Research Foundation, West Lafayette, IN (US)

(72) Inventor: Joshua M. Alexander, Lafayette, IN (US)

(73) Assignee: PURDUE RESEARCH FOUNDATION, West Lafayette, IN (US)

(*) Notice: Subject to any disclaimer, the term of this patent is extended or adjusted under 35 U.S.C. 154(b) by 0 days.

(21) Appl. No.: 14/842,256

(22) Filed: Sep. 1, 2015

(65) Prior Publication Data

US 2015/0371648 A1 Dec. 24, 2015

Related U.S. Application Data

(63) Continuation of application No. 13/906,021, filed on May 30, 2013, now Pat. No. 9,173,041.

(Continued)

(51) Int. Cl.
*H04R 25/00* (2006.01)
*G10L 19/02* (2013.01)
(Continued)

(52) U.S. Cl.
CPC .............. *G10L 19/02* (2013.01); *G10L 15/08* (2013.01); *G10L 15/22* (2013.01); *G10L 15/265* (2013.01);
(Continued)

(58) Field of Classification Search
CPC ...... H04R 25/00; H04R 25/35; H04R 25/353; H04R 25/356; H04R 25/50; H04R 25/502;
(Continued)

(56) References Cited

U.S. PATENT DOCUMENTS 7,949,522 B2 5/2011 Hetherington et al.
2004/0131203 A1 7/2004 Liljeryd et al.
(Continued)

FOREIGN PATENT DOCUMENTS

WO 2012076044 A1 6/2012

OTHER PUBLICATIONS

Joshua M. Alexander, Ph.D., Individual Variability in Recognition of Frequency-Lowered Speech, Seminars in Hearing, vol. 34, No. 2, pp. 86-109, (2013), Thieme Medical Publishers, Inc., New York, NY.

(Continued)

*Primary Examiner* — Sean H Nguyen
(74) *Attorney, Agent, or Firm* — Rossi, Kimms & McDowell LLP

(57) ABSTRACT

Among other things, a sound processing device system is disclosed to assist a hearing-impaired human listener recognize speech sounds or phonemes. The device system may be configured at least to generate an output audio signal at least by transposing and causing a negative rank ordering of frequency of at least a portion of the input audio signal. Compression also may be performed on the at least the portion of the input audio signal as part of generating the output audio signal. The negative rank ordering may be performed on a high-frequency portion of the input audio signal that becomes a low-frequency portion of the output audio signal by the transposing. The low-frequency portion of the output audio signal may represent an inverted ordering of frequencies or frequency segments present in the high-frequency portion of the input audio signal.

16 Claims, 18 Drawing Sheets

Frequency I/O functions reported by Shames and Alexander (2011) which serve as a basis of comparison for evaluating performance of the method 700.

Related U.S. Application Data

(60) Provisional application No. 61/653,599, filed on May 31, 2012.

(51) Int. Cl.
*H04R 5/00* (2006.01)
*G10L 17/00* (2013.01)
*G10L 15/22* (2006.01)
*G10L 15/08* (2006.01)
*G10L 15/26* (2006.01)
*G10L 21/0208* (2013.01)

(52) U.S. Cl.
CPC ........ *G10L 17/005* (2013.01); *G10L 21/0208* (2013.01); *H04R 5/00* (2013.01); *H04R 25/00* (2013.01); *H04R 25/35* (2013.01); *H04R 25/353* (2013.01); *H04R 25/356* (2013.01); *H04R 25/40* (2013.01); *H04R 25/407* (2013.01); *H04R 25/50* (2013.01); *H04R 25/502* (2013.01); *H04R 25/505* (2013.01); *H04R 2225/43* (2013.01)

(58) Field of Classification Search
CPC .... H04R 25/505; H04R 25/40; H04R 25/407; H03G 5/00; G10L 21/0208; G10L 15/22; G10L 15/265; G10L 17/005
USPC ............. 381/312.98; 704/231, 200, 246, 251
See application file for complete search history.

(56) References Cited

U.S. PATENT DOCUMENTS

| | | | |
|---|---|---|---|
| 2011/0098785 A1 | 4/2011 | Mishra | |
| 2012/0328124 A1* | 12/2012 | Kjoerling | G10L 21/038 381/98 |
| 2014/0105435 A1* | 4/2014 | Allegro-Baumann | H04R 25/353 381/320 |

OTHER PUBLICATIONS

Jane Auriemmo et al., Effect of Linear Frequency Transposition on Speech Recognition and Production of School-Age Children, Journal of the American Academy of Audiology, vol. 20, No. 5, 2009, pp. 289-305, Widex USA, Long Island City, NY.

Thomas Baer et al., Effects of low pass filtering on the intelligibility of speech in noise for people with and without dead regions at high frequencies, Department of Experimental Psychology, University of Cambridge, J. Acoust. Soc. Am., vol. 112, No. 3, Pt. 1, Sep. 2002, pp. 1133-1144.

Robert Allen Fox et al., Sex-Related Acoustic Changes in Voiceless English Fricatives, Journal of Speech, Language, and Hearing Research, vol. 48, pp. 753-765, Aug. 2005.

Brian R. Glasberg et al., Derivation of auditory filter shapes from notched-noise data, Department of Experimental Psychology, University of Cambridge, Hearing Research, 47 (1990) 103-138, Elsevier Science Publishers B.V. (Biomedical Division).

Dennis H. Klatt, Software for a cascade/parallel formant synthesizer, Massachusetts Institute of Technology, Cambridge, Massachusetts, J. Acoustical Society of America 67(3), Mar. 1980, pp. 971-995.

Francis Kuk et al., Efficacy of Linear Frequency Transposition on Consonant Identification in Quiet and in Noise, Journal of the American Academy of Audiology, vol. 20, No. 8, 2009, Widex Office of Research in Clinical Amplification (ORCA), Widex Hearing Aid Company, pp. 465-479.

Mary Pat Moeller et al., Vocalizations of Infants with Hearing Loss Compared with Infants with Normal Hearing: Part I—Phonetic Development, Boys Town National Research Hospital; Omaha, Nebraska; and Arizona State University, Tempe, Arizona, Ear & Hearing, vol. 28, No. 5, 605-627, 2007, Lippincott Williams & Wilkins.

Mary Pat Moeller et al., Longitudinal Development of Phonology and Morphology in Children With Late-Identified Mild-Moderate Sensorineural Hearing Loss, Boys Town National Research Hospital, Omaha, Nebraska, Ear & Hearing, vol. 31, No. 5, pp. 625-635, 2010, Lippincott Williams & Wilkins.

Brian C. J. Moore, Dead Regions in the Cochlea: Conceptual Foundations, Diagnosis, and Clinical Applications, Department of Experimental Psychology, University of Cambridge, Ear & Hearing, vol. 25, No. 2, pp. 98-116, 2004, Lippincott Williams & Wilkins.

Floyd Rudmin, The Why and How of Hearing /S/, Hearing Care Consulting in Kingston, Ontario, The Volta Review, pp. 263-269, Oct.-Nov. 1983.

Andrea Simpson, PhD, Frequency-Lowering Devices for Managing High-Frequency Hearing Loss: A Review, University of Manchester, Trends in Amplification, vol. 13, No. 2, pp. 87-106, Jun. 2009.

Andrea Simpson et al., Improvements in speech perception with an experimental nonlinear frequency compression hearing device, British Society of Audiology, International Society of Audiology, and Nordic Audiological Society, International Journal of Audiology 2005; 44:281-292, Taylor and Francis Group.

Patricia G. Stelmachowicz et al., Effect of stimulus bandwidth on the perception of /s/ in normal- and hearing-impaired children and adults, Boys Town National Research Hospital, Omaha, Nebraska, Acoustical Society of America vol. 110, No. 4, pp. 2183-2190, Oct. 2001.

Ann E. Todd et al., Production of contrast between sibilant fricatives by children with cochlear implants, University of Wisconsin Waisman Center, Madison, Wisconsin, Acoustical Society of America, vol. 130, No. 6, pp. 3969-3979, Dec. 2011.

Deborah A. Vickers et al., Effects of low-pass filtering on the intelligibility of speech in quiet for people with and without dead regions at high frequencies, Department of Experimental Psychology, University of Cambridge, Acoustical Society of America, vol. 110, No. 2, pp. 1164-1175, Aug. 2001.

Jace Wolfe et al., Long-term effects of non-linear frequency compression for children with moderate hearing loss, 2011 British Society of Audiology, International Society of Audiology, and Nordic Audiological Society, International Journal of Audiology 2011; 50: 396-404.

Office Action issued in U.S. Appl. No. 13/906,021, dated Jan. 27, 2015.

Notice of Allowance issued in U.S. Appl. No. 13/906,021, dated Aug. 14, 2015.

* cited by examiner

Negative Rank Scaling I/O functions with p = 1.75 and maxFout set at 1500, 2000, 2500, and 3000 Hz to accommodate hearing loss of varying severity.

*Negative Rank Scaling I/O functions with maxFout set at 1500 Hz and varying from p=0.5 to p=2.5 in 0.5 increments. Shifting the function toward the lower left should increase perception of /s/.*

Negative Rank Scaling I/O functions with the same parameters as FIG. 9, except on an ERB scale. The dotted lines are linear on this scale and show that the functions are psychophysically expansive.

Frequency I/O functions reported by Shames and Alexander (2011) which serve as a basis of comparison for evaluating performance of the method 700.

ENHANCING PERCEPTION OF FREQUENCY-LOWERED SPEECH

CROSS-REFERENCE TO RELATED APPLICATIONS

This application is a continuation of U.S. patent application Ser. No. 13/906,021, filed May 30, 2013, which claims the benefit of U.S. Provisional Application No. 61/653,599, filed May 31, 2012 (the "'599 Provisional Application"), the entire disclosure of both applications, including the appendix of the '599 Provisional Application, is hereby incorporated herein by reference.

STATEMENT OF GOVERNMENT INTEREST

This invention was made with government support under Grant No. DC010601 awarded by the National Institutes of Health. The government has certain rights in the invention.

TECHNICAL FIELD

Some embodiments of this invention pertain to a hearing aid device or device system that performs negative rank ordering of frequency of an input audio signal, which, among other things, improves recognition of sibilant fricatives over conventional techniques.

BACKGROUND

A variety of conventional techniques for assisting those with high-frequency hearing loss involve lowering high-frequency speech information into lower-frequency regions. Common to all these techniques is a positive rank scaling of frequency, such that the ordering, from lowest to highest, of frequency components in the higher frequency region of the input that is to be moved to the lower-frequency region is maintained in the output (after lowering into the lower-frequency region).

For example, FIG. 1 illustrates some of these conventional techniques involving positive rank scaling. In particular, FIG. 1(a) illustrates an example frequency range 101 of sound, a high-frequency region 104, which is illustrated as inaudible to a theoretical hearing-impaired person, and a low-frequency region 102, which is illustrated as audible to the theoretical hearing-impaired person.

FIGS. 1(b)-(e) illustrate conventional techniques for assisting the hearing-impaired person hear the high-frequency inaudible region 104 by shifting sounds within the high-frequency inaudible region 104 to the lower-frequency audible region 102. In this regard, it can be seen in FIG. 1 that in principle none of these techniques produce sound within the inaudible region 104 and, consequently, each of these techniques is illustrated within the audible region 102. In addition, each of these techniques involves positive rank scaling, as discussed below.

To elaborate, FIG. 1(b) illustrates a conventional linear frequency compression technique 106. This technique searches for sound within the high-frequency inaudible region 104. If sound is detected within the high-frequency inaudible region 104, such as during time period 106b, the entire frequency range 101 is linearly compressed so that it fits within the lower frequency audible region 102. This linear compression is illustrated in FIG. 1(b) with the uniform zigzag line 107, which has consistent internal angles. Such linear compression exhibits positive rank scaling by maintaining, in the post-compression output, the ordering of the frequencies present in the input sound pre-compression. When the hearing aid device does not detect sound within the high-frequency inaudible region 104, no compression of the input sound occurs, such as during time periods 106a and 106c.

FIG. 1(c) illustrates a conventional linear frequency transposition technique 108. This technique continually searches for an intense spectral peak in a limited frequency range called a "source region." This "source region" is within the inaudible region 104. When an intense spectral peak is detected within the "source region", a frequency range including the intense spectral peak is transposed one octave below into the audible region 102 as illustrated by the transposed regions 108a-c. Each of these transposed regions 108a-c exhibits positive rank scaling, in that the ordered relationship between frequencies in the transposed input sound is maintained in the transposed regions of the output sound.

FIG. 1(d) illustrates a conventional spectral feature translation technique 110. This technique searches for spectral features in the high-frequency inaudible region 104 that are characteristic of speech. If it is detected that there is a likelihood that speech information exists in the high-frequency inaudible region 104, such as during time period 110b, a frequency range including the suspected high-frequency speech information is transposed or translated on an octave scale into the lower-frequency audible range 102. This translated frequency range is illustrated in FIG. 1(d) with the box 110d and exhibits positive rank scaling, in that the ordered relationship between frequencies in the transposed input sound is maintained in the transposed region of the output sound. If it is detected that there is not a likelihood that speech information exists in the high-frequency inaudible region 104, such as during time periods 110a and 110c, no translation of the input sound occurs.

FIG. 1(e) illustrates a conventional nonlinear frequency compression technique. This technique compresses frequencies above a start frequency 112a non-linearly over time to emphasize certain frequencies or ranges, while maintaining positive rank scaling in the compressed region. This nonlinear compression is illustrated by the non-uniform zigzag lines having differing internal angles shown in FIG. 1(e), one of which is called out as reference 112b. The frequencies below the start frequency 112a are not compressed.

While the conventional techniques of FIG. 1, and other conventional techniques involving positive rank scaling in shifted frequencies, assist hearing-impaired individuals in hearing otherwise inaudible sounds, there is a need in the art for further improvement of hearing aid devices.

SUMMARY

At least the above-described problems are addressed and technical solutions are achieved in the art at least by a sound processing device system configured to assist a hearing-impaired human listener recognize sounds according to various embodiments of the present invention. The sound processing device system may include a memory device system; and a data processing device system communicatively connected to the memory device system. The data processing device system may be configured by a program stored in the memory device system at least to receive an input audio signal; and generate an output audio signal at least by transposing and causing a negative rank ordering of frequency of at least a portion of the input audio signal.

In some embodiments of the present invention, the data processing device system is configured by the program at least to generate an output audio signal at least by transposing and causing a negative rank ordering of a high-frequency portion of the input audio signal, the high frequency portion of the input audio signal becoming a low-frequency portion of the output audio signal. The low-frequency portion of the output audio signal may represent an inverted ordering of frequencies present in the high-frequency portion of the input audio signal.

In some embodiments, the negative rank ordering includes an inversion of an ordering of frequencies present in the at least the portion of the input audio signal.

In some embodiments, the sound processing device system further includes a sound receiving device system and a sound producing device system. The sound receiving device system may be communicatively connected to the data processing device system and may be configured to receive sound and generate the input audio signal. The sound producing device system may be communicatively connected to the data processing device system and may be configured to produce sound based upon the output audio signal.

In some embodiments, the negative rank ordering includes frequency inverting and compressing the at least the portion of the input audio signal.

In some embodiments, the input audio signal is a first portion of an input audio signal stream, and the output audio signal is a first portion of an output audio signal stream. In this regard, the data processing device system may be further configured by the program at least to (a) identify a speech pattern present in the first portion of the input audio signal stream; (b) generate, in response to the speech pattern being identified as present in the first portion of the input audio signal stream, the first portion of the output audio signal stream at least by inverting a frequency relationship of at least part of the first portion of the input audio signal stream; (c) identify that the speech pattern is not present in a second portion of the input audio signal stream that is other than the first portion of the input audio signal stream; and (d) generate, in response to identifying that the speech pattern is not present in the second portion of the input audio signal stream, a second portion of the output audio signal stream without inverting the frequency relationship of at least part of the second portion of the input audio signal stream, the second portion of the output audio signal stream being other than the first portion of the output audio signal stream. The speech pattern may be frication.

In some embodiments, the data processing device system is further configured by the program at least to: (e) identify that the first portion of the input audio signal stream exhibits higher energy at a high-frequency range as compared to a mid-frequency range of the first portion of the input audio signal stream; and (f) cause, by way of at least a gain, an attenuation, or both a gain and an attenuation, and in response to identifying that the first portion of the input audio signal stream exhibits the higher energy at the high-frequency range, a low-frequency range of the first portion of the output audio signal stream to be relatively emphasized or de-emphasized as compared to another frequency range of the first portion of the output audio signal stream or another time segment of the output audio signal stream to generate a perceptual cue to facilitate distinguishing of similar sounds, the low-frequency range of the first portion of the output audio signal stream corresponding, prior to the inverting the frequency relationship of the first portion of the input audio signal stream, to the high-frequency range of the first portion of the input audio signal stream.

In some embodiments, the data processing device system is further configured by the program at least to: (g) identify a speech pattern present in a third portion of the input audio signal stream that is other than the first portion of the input audio signal stream and the second portion of the input audio signal stream; (h) generate, in response to the speech pattern being identified as present in the third portion of the input audio signal stream, a third portion of the output audio signal stream at least by inverting a frequency relationship of the third portion of the input audio signal stream, the third portion of the output audio signal stream being other than the first portion of the output audio signal stream and the second portion of the output audio signal stream; (i) identify that the third portion of the input audio signal stream exhibits higher energy at a mid-frequency range as compared to a high-frequency range of the third portion of the input audio signal stream; and (j) output the third portion of the output audio signal stream without causing, by way of at least a gain, an attenuation, or both a gain and an attenuation, a low-frequency range of the third portion of the output audio signal stream to be relatively emphasized or de-emphasized as compared to another frequency range of the third portion of the output audio signal stream or another time segment of the output audio signal stream, the low-frequency range of the third portion of the output audio signal stream corresponding, prior to the inverting the frequency relationship of the third portion of the input audio signal stream, to the high-frequency range of the third portion of the input audio signal stream.

In some embodiments, the data processing device system is further configured by the program at least to: (a) determine whether or not the input audio signal exhibits higher energy at a high-frequency range than at a mid-frequency range of the input audio signal; and (b) cause, by way of at least a gain, an attenuation, or both a gain and an attenuation, and in response to determining that the input audio signal exhibits the higher energy at the high-frequency range, a low-frequency range of the output audio signal to be relatively emphasized or de-emphasized as compared to another frequency range or another time segment of the output audio signal to generate a perceptual cue to facilitate distinguishing of similar sounds, the low-frequency range of the output audio signal corresponding, prior to the transposing and negative rank ordering of the input audio signal, to the high-frequency range of the input audio signal.

In some embodiments, the data processing device system is further configured by the program at least to (a) determine whether or not the output audio signal exhibits higher energy at a low-frequency range than at a mid-frequency range of the output audio signal; and (b) cause, by way of at least a gain, an attenuation, or both a gain and an attenuation, and in response to determining that the input audio signal exhibits the higher energy at the high-frequency range, the low-frequency range of the output audio signal to be relatively emphasized or de-emphasized as compared to another frequency range or another time segment of the output audio signal to generate a perceptual cue to facilitate distinguishing of similar sounds, the low-frequency range of the output audio signal corresponding, prior to the transposing and negative rank ordering of the input audio signal, to the high-frequency range of the input audio signal.

In some embodiments, a sound processing device system is configured to assist a hearing-impaired human listener recognize sounds, the sound processing device system including a memory device system and a data processing device system communicatively connected to the memory device system. In at least some of these embodiments, the data processing device system is configured by a program stored in the memory device system at least to: (1) receive an input audio signal; (2) generate an output audio signal based at least upon a processing of the input audio signal; and (3) determine that (a) the input audio signal exhibits higher energy at a high-frequency range as compared to a mid-frequency range of the input audio signal, or (b) the output audio signal exhibits higher energy at a low-frequency range as compared to a mid-frequency range of the output audio signal, wherein, in response to determining (a) or (b), the data processing device system is configured by the program at least to cause the output audio signal to include a perceptual cue at least by including an emphasis or a de-emphasis of the low-frequency range of the output audio signal as compared to another frequency range or another time segment of the output audio signal at least by an application of a gain, an attenuation, or both a gain and an attenuation, the perceptual cue being caused to be included regardless of frequency regions where hearing loss is occurring for the hearing-impaired human listener.

In this regard, the sound processing device may include a sound receiving device system communicatively connected to the data processing device system and configured to receive sound and generate the input audio signal; and a sound producing device system communicatively connected to the data processing device system and configured to produce sound based upon the output audio signal.

The processing of the input audio signal may include transposing and causing a negative rank ordering of frequency of at least a portion of the input audio signal. The negative rank ordering may include an inversion of an ordering of frequencies present in the at least the portion of the input audio signal.

The processing of the input audio signal may include frequency inverting and compressing at least the portion of the input audio signal.

The processing of the input audio signal may include transposing and causing a negative rank ordering of the high-frequency portion of the input audio signal, the high frequency portion of the input audio signal becoming the low-frequency portion of the output audio signal.

The input audio signal may be a first portion of an input audio signal stream, the output audio signal may be a first portion of an output audio signal stream, and the data processing device system may be further configured by the program at least to: (4) identify a speech pattern present in the first portion of the input audio signal stream; (5) generate, in response to the speech pattern being identified as present in the first portion of the input audio signal stream, the first portion of the output audio signal stream at least by transposing and causing a negative rank ordering of frequency of at least part of the first portion of the input audio signal stream; (6) identify that the speech pattern is not present in a second portion of the input audio signal stream that is other than the first portion of the input audio signal stream; and (7) generate, in response to identifying that the speech pattern is not present in the second portion of the input audio signal stream, a second portion of the output audio signal stream without inverting a frequency relationship of at least part of the second portion of the input audio signal stream, the second portion of the output audio signal stream being other than the first portion of the output audio signal stream.

In some embodiments, a hearing aid device system includes a sound receiving device system, a sound producing device system, a memory device system, and a data processing device system. The sound receiving device system may be configured to receive sound and generate an input audio signal. The sound producing device system may be configured to produce sound based upon an output audio signal. The data processing device system may be communicatively connected to the memory device system, the sound receiving device system, and the sound producing device system, and the data processing device system may be configured by a program stored in the memory device system at least to: (i) receive the input audio signal; (ii) identify a speech pattern present in the input audio signal; (iii) generate, in response to the speech pattern being identified as present in the input audio signal, the output audio signal at least by transposing and causing a negative rank scaling of frequency of at least a portion of the input audio signal; (iv) identify that the input audio signal exhibits higher energy at a high-frequency range as compared to a mid-frequency range of the input audio signal; and (v) cause, by way of at least a gain, an attenuation, or both a gain and an attenuation, and in response to determining that the input audio signal exhibits the higher energy at the high-frequency range, a low-frequency range of the output audio signal to be relatively emphasized or de-emphasized as compared to another frequency range or another time segment of the output audio signal to generate a perceptual cue to facilitate distinguishing of similar sounds, the low-frequency range of the output audio signal corresponding, prior to the transposing and causing the negative rank scaling of frequency of the input audio signal, to the high-frequency range of the input audio signal.

The features of each of the embodiments described above may be combined in any possible permutation in other respective embodiments of the present invention. In addition, the systems, according to the embodiments described above, may be implemented as respective methods or as respective one or more computer-readable mediums storing one or more computer-executable programs comprising computer-executable instructions configured to execute such methods. The above-discussed memory device systems and computer-readable mediums are one or more non-transitory computer-readable memories or mediums, according to at least some embodiments of the present invention.

In addition to the embodiments described above, further embodiments will become apparent by reference to the drawings and by study of the following detailed description.

BRIEF DESCRIPTION OF THE DRAWINGS

The present invention will be more readily understood from the detailed description of embodiments presented below considered in conjunction with the attached drawings, of which:

FIGS. 11-18 pertain to comparative examples between embodiments of the present invention and conventional techniques.

It is to be understood that the attached drawings are for purposes of illustrating the concepts of the invention and may not be to scale.

DETAILED DESCRIPTION

Figure 1:
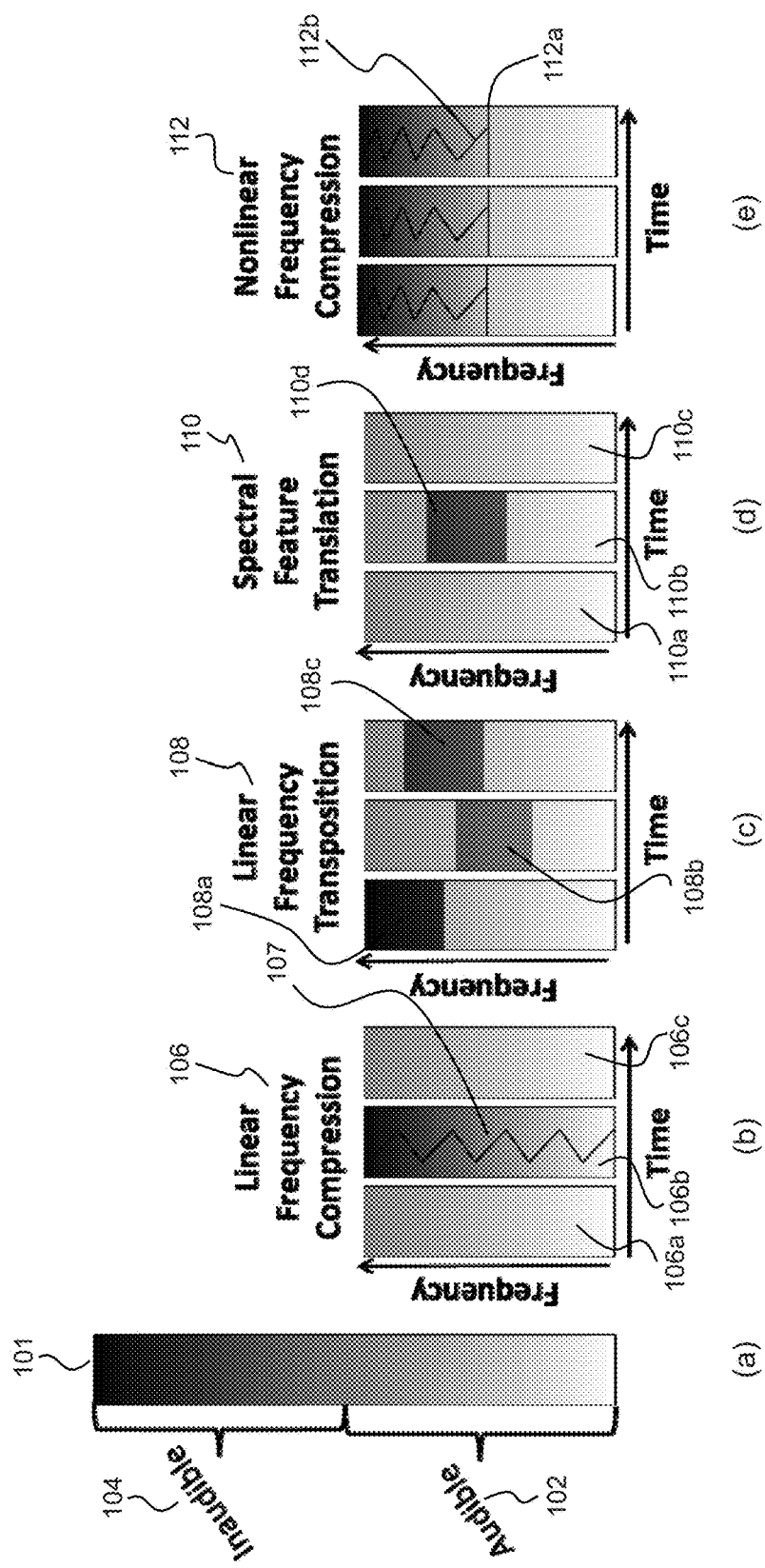
FIG. 1 illustrates some conventional techniques for compensating for an individual's high-frequency hearing loss.
Figure 2:
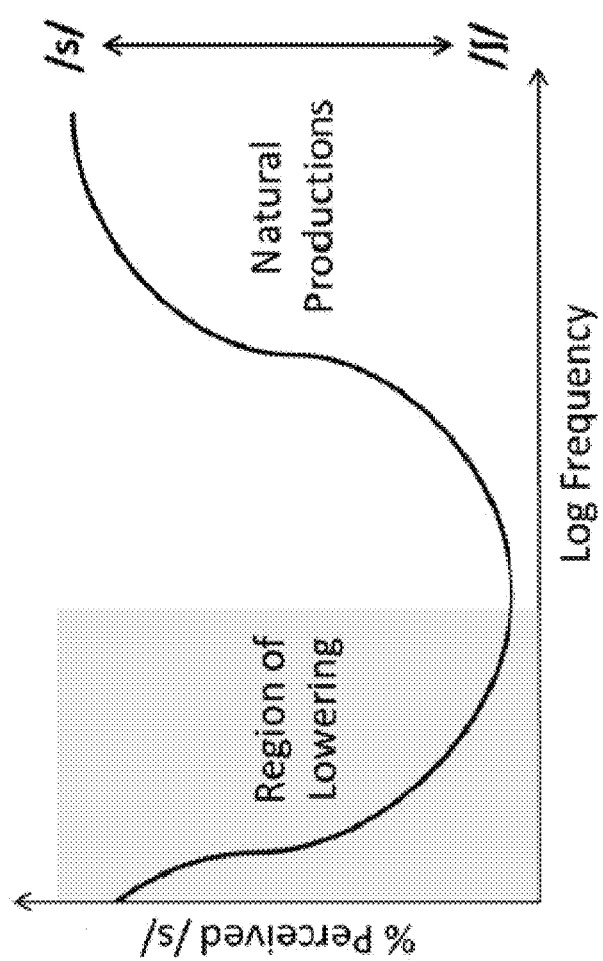
FIG. 2 illustrates a relationship between spectral peak frequency and perception of /s/, according to some embodiments of the present invention.

The inventor notes that a shortcoming of the conventional techniques of FIG. 1, and other conventional techniques involving positive rank scaling in shifted frequencies, is an increase in confusion between the sibilant fricatives (/s/ and /ʃ/ or "sh"). In particular, frequency-lowered /s/ is more often perceived as /ʃ/, which naturally has a lower spectral peak. Data gathered under the direction of the inventor has revealed an unexpected relationship between the frequency-lowered spectral peak and perception: a nonmonotonic relationship exists such that perception of /s/ returns when spectral peaks are very low in frequency. See, e.g., FIG. 2, which illustrates a relationship between spectral peak frequency and perception of /s/.

Some embodiments of the present invention utilize this relationship by generating an output audio signal at least by transposing (e.g., by lowering in frequency) and causing a negative rank ordering or scaling of at least a portion (e.g., one or more frequency ranges, one or more time segments, or both) of the input audio signal. In some embodiments, this negative rank ordering or scaling is implemented as a reciprocal function of frequency at least in a frequency band of interest, where at least the frequency band is inverted so that what is very high in frequency at the input becomes very low in frequency at the output, and what is toward the middle of the spectrum on the input stays toward the middle of the spectrum at the output (e.g., closer to its natural place of origin). See, e.g., FIG. 3, which illustrates an example frequency I/O relationship that preserves /s/ and /ʃ/ discrimination after lowering the input frequency with negative rank ordering or scaling, according to some embodiments of the present invention.

Figure 3:
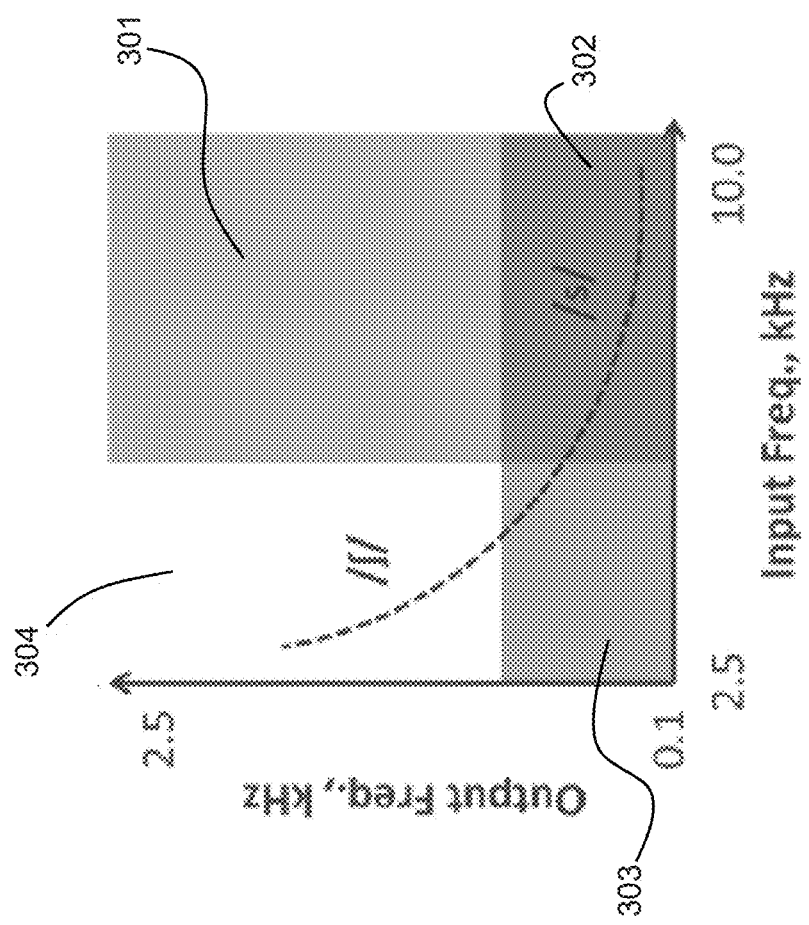
FIG. 3 illustrates an example frequency I/O relationship that preserves /s/ and /ʃ/ discrimination after lowering the input frequency with negative rank ordering or scaling, according to some embodiments of the present invention.

With respect to FIG. 3, the natural productions of /s/ across talkers and articulatory contexts have peak energy between 4 and 10 kHz (e.g., the input region denoted by reference numerals 301 and 302) and natural productions of /ʃ/ have peak energy between 2 and 5 kHz (e.g., the input regions denoted by reference numerals 303 and 304, as well as some overlap (not shown in FIG. 3) with regions 301 and 302 between 4 and 5 kHz on the input side). At higher output frequencies (e.g., >500 Hz represented by regions 301 and 304), peak energy will more likely be perceived as /ʃ/. In this regard, reference numeral 301 represents a region where a frequency-lowered (e.g., by way of negative rank ordering or scaling of frequency) /s/ would likely be perceived as /ʃ/. At the lowest output frequencies (e.g., <500 Hz represented by regions 302 and 303), peak energy will more likely be perceived as /s/. In this regard, reference numeral 303 represents a region where a frequency-lowered /ʃ/ would likely be perceived as /s/. In order to have a natural production of /s/ be perceived as such after frequency lowering, according to some embodiments, the frequency I/O function (black dotted line in FIG. 3) falls within the region 302, and falls within the region 304 for /ʃ/.

Figure 4:
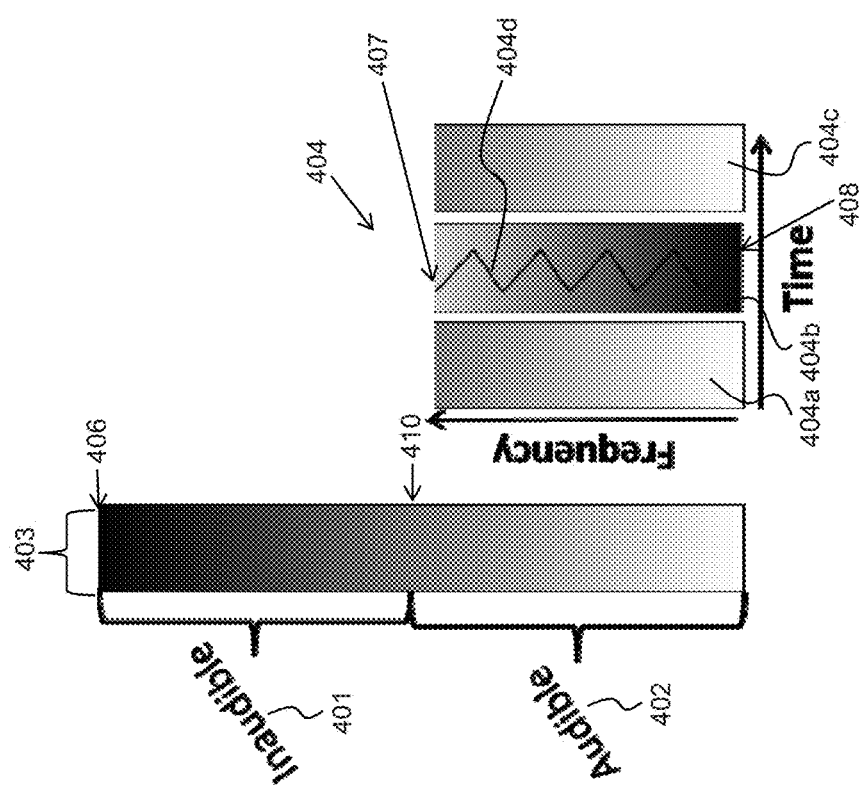
FIG. 4 illustrates example output of an implementation involving negative rank ordering or scaling of frequency, according to some embodiments of the present invention.

FIG. 4 illustrates example output 404 of an implementation involving negative rank scaling of frequency, according to some embodiments of the present invention. In this regard, FIG. 4 illustrates a non-limiting example where negative rank scaling of frequency is applied to an input audio signal during time period 404b. The negative rank scaling applied during time period 404b, according to these embodiments, inverts input audio signal frequencies or a frequency relationship thereof within the higher-frequency inaudible region 401 and transposes, shifts, or translates them to the lower-frequency audible region 402. Accordingly, a highest frequency 406 within the inaudible region 401 becomes the lowest frequency 408 within the audible region 402, and a low frequency 410 in the inaudible region 401 (which actually is a middle frequency in the spectrum 403) shifts a small amount to become a frequency 407 within the audible region 402 (and remains a middle frequency in the spectrum 403).

Some embodiments implementing negative rank ordering or scaling of frequency, such as that shown in FIG. 4, may include a timing component, where the negative rank ordering or scaling is selectively applied over time, depending upon characteristics of the input audio signal. Examples of such characteristics will be described in greater detail below with respect to FIG. 7 (e.g., block 704). In the example embodiments of FIG. 4, negative rank ordering or scaling is not applied during time periods 404a and 404c, whereas negative rank ordering or scaling is applied during time period 404b, based on an analysis of characteristics of the input audio signal.

Some embodiments implementing negative rank ordering, such as that shown in FIG. 4, may include frequency compression, such as non-linear compression. In this regard, the phrase, "negative rank scaling" may be used to indicate negative rank ordering of frequencies that involves frequency compression. On the other hand, the phrase "negative rank ordering" should not be interpreted to exclude the possibility of frequency compression. The example embodiments of FIG. 4 illustrate non-linear compression with the non-uniform zigzag line 404d having differing internal angles. The compression applied may vary based on a human-listener's personal characteristics, and further details and examples of such compression with respect to some embodiments of the present invention are provided with respect to FIGS. 8 and 9, discussed below. In some embodiments, the compression may be provided by sine wave oscillators that synthesize frequencies lowered by a negative rank ordering process according to an embodiment of the present invention following signal analysis via Fast Fourier Transform.

The formation of the output audio signal by way of a negative rank scaling of frequency, according to at least one embodiment of the present invention, has been demonstrated to improve recognition of, not only of /s/ and /ʃ/, but also for other phonemes, including /t/, /k/, /z/, /d₃/("j"), /tʃ/ ("ch"), and /j/ ("y"), as compared to conventional positive rank scaling techniques.

Figure 5:
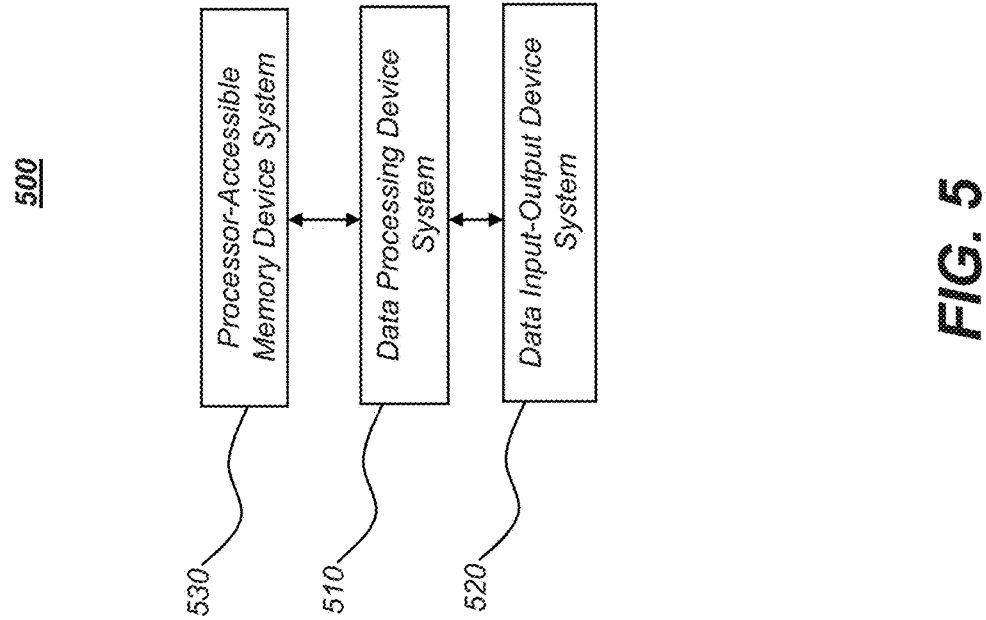
FIG. 5 illustrates an example hardware configuration of a sound processing device system 500 configured to assist a hearing-impaired human listener recognize sounds at least by implementing negative rank ordering or scaling of frequency, according to some embodiments of the present invention.

FIG. 5 illustrates an example hardware configuration of a sound processing system 500 configured to assist a hearing-impaired human listener recognize sounds at least by implementing negative rank ordering or scaling of frequency, according to some embodiments of the present invention.

It is noted that reference throughout this specification to "one embodiment" or "an embodiment" or "an example embodiment" or "an illustrated embodiment" or "a particular embodiment" and the like means that a particular feature, structure or characteristic described in connection with the embodiment is included in at least one embodiment. Thus, the appearances of the phrases "in one embodiment" or "in an embodiment" or "in an example embodiment" or "in this illustrated embodiment" or "in this particular embodiment" and the like in various places throughout this specification are not necessarily all referring to one embodiment or a same embodiment. Furthermore, the particular features, structures, or characteristics of different embodiments may be combined in any suitable manner to form one or more other embodiments.

It additionally is noted that, unless otherwise explicitly stated or required by context, the word "or" is used in this disclosure in a non-exclusive sense. Further, unless otherwise explicitly noted or required by context, the word "set" is intended to mean one or more, and the word "subset" is intended to mean a set having the same or fewer elements of those present in the subset's parent or superset.

Further, the phrase "at least" is used herein to emphasize the possibility that other elements can exist besides those explicitly listed. However, unless otherwise explicitly noted (such as by the use of the term "only") or required by context, non-usage herein of the phrase "at least" includes the possibility that other elements exist besides those explicitly listed. For example, the phrase, 'based at least upon A' includes A, as well as one or more other additional elements besides A. In the same manner, the phrase, 'based upon A" includes A, as well as one or more other additional elements besides A. However, the phrase, 'based only upon A' includes only A.

The term "program" in this disclosure should be interpreted as a set of instructions or modules that can be executed by one or more components in a system, such as a controller system or data processing device system, in order to cause the system to perform one or more operations. The set of instructions or modules can be stored by any kind of memory device, such as those described subsequently with respect to the memory device system 530 shown in FIG. 5. In addition, this disclosure may describe that the instructions or modules of a program are configured to cause the performance of an action. The phrase "configured to" in this context is intended to include at least (a) instructions or modules that are presently in a form executable by one or more data processing devices to cause performance of the action (e.g., in the case where the instructions or modules are in a compiled and unencrypted form ready for execution), and (b) instructions or modules that are presently in a form not executable by the one or more data processing devices, but could be translated into the form executable by the one or more data processing devices to cause performance of the action (e.g., in the case where the instructions or modules are encrypted in a non-executable manner, but through performance of a decryption process, would be translated into a form ready for execution). The word "module" may be defined as a set of instructions.

The word "device" and the phrase "device system" both are intended to include one or more physical devices or sub-devices (e.g., pieces of equipment) that interact to perform one or more functions, regardless of whether such devices or sub-devices are located within a same housing or different housings. In this regard, the word "device", may equivalently be referred to as a "device system".

Further, the phrase "in response to" may be used in this disclosure. For example, this phrase might be used in the following context, where an event A occurs in response to the occurrence of an event B. In this regard, such phrase includes, for example, that at least the occurrence of the event B causes or triggers the event A.

Returning to the particulars of FIG. 5, the system 500 may include a data processing device system 510, an input-output device system 520, and a processor-accessible memory device system 530. The processor-accessible memory device system 530 and the input-output device system 520 are communicatively connected to the data processing device system 510.

The data processing device system 510 includes one or more data processing devices that implement or execute, in conjunction with other devices, such as those in the system 500, methods of various embodiments of the present invention. Each of the phrases "data processing device", "data processor", "processor", and "computer" is intended to include any data processing device, such as a central processing unit ("CPU"), a desktop computer, a laptop computer, a mainframe computer, tablet computer, a personal digital assistant, a cellular (smart) phone, and any other device for processing data, managing data, or handling data, whether implemented with electrical, magnetic, optical, biological components, or otherwise.

The memory device system 530 includes one or more processor-accessible memory devices configured to store information, including the information needed to execute the methods of various embodiments. The memory device system 530 may be a distributed processor-accessible memory device system including multiple processor-accessible memory devices communicatively connected to the data processing device system 510 via a plurality of computers and/or devices. On the other hand, the memory device system 530 need not be a distributed processor-accessible memory system and, consequently, may include one or more processor-accessible memory devices located within a single data processing device.

Each of the phrases "processor-accessible memory" and "processor-accessible memory device" is intended to include any processor-accessible data storage device, whether volatile or nonvolatile, electronic, magnetic, optical, or otherwise, including but not limited to, registers, floppy disks, hard disks, Compact Discs, DVDs, flash memories, ROMs, and RAMs. In some embodiments, each of the phrases "processor-accessible memory" and "processor-accessible memory device" is intended to include a non-transitory computer-readable storage medium. And in some embodiments, the memory device system 530 can be considered a non-transitory computer-readable storage medium system.

The phrase "communicatively connected" is intended to include any type of connection, whether wired or wireless, between devices, data processors, or programs in which data may be communicated. Further, the phrase "communicatively connected" is intended to include a connection between devices or programs within a single data processor, a connection between devices or programs located in different data processors, and a connection between devices not located in data processors at all. In this regard, although the memory device system 530 is shown separately from the data processing device system 510 and the input-output device system 520, one skilled in the art will appreciate that the memory device system 530 may be located completely or partially within the data processing device system 510 or the input-output device system 520. Further in this regard, although the input-output device system 520 is shown separately from the data processing device system 510 and the memory device system 230, one skilled in the art will appreciate that such system may be located completely or partially within the data processing system 510 or the memory device system 530, depending upon the contents of the input-output device system 520. Further still, the data processing device system 510, the input-output device system 520, and the memory device system 530 may be located entirely within the same device or housing or may be separately located, but communicatively connected, among different devices or housings. In the case where the data processing device system 510, the input-output device system 520, and the memory device system 530 are located within the same device, the system 500 of FIG. 5 can be implemented by a single application-specific integrated circuit (ASIC) in some embodiments.

The input-output device system 520 may include a microphone, a mouse, a keyboard, a touch screen, another computer, a processor-accessible memory device, or any device or combination of devices from which a desired selection, desired information, instructions, sound, or any other data is input to the data processing device system 510. The input-output device system 520 may include a user-activatable control system that is responsive to a user action. The input-output device system 520 may include any suitable interface for receiving information, instructions, or any data from other devices and systems described in various ones of the embodiments of the present invention.

The input-output device system 520 also may include a speaker, a display device system, a processor-accessible memory device, or any device or combination of devices to which information, instructions, sound, or any other data is output by the data processing device system 510. The input-output device system 220 may include any suitable interface for outputting information, instructions, or data to other devices and systems described in various ones of the embodiments.

If the input-output device system 520 includes a processor-accessible memory device, such memory device may or may not form part or all of the memory device system 530.

Figure 6:
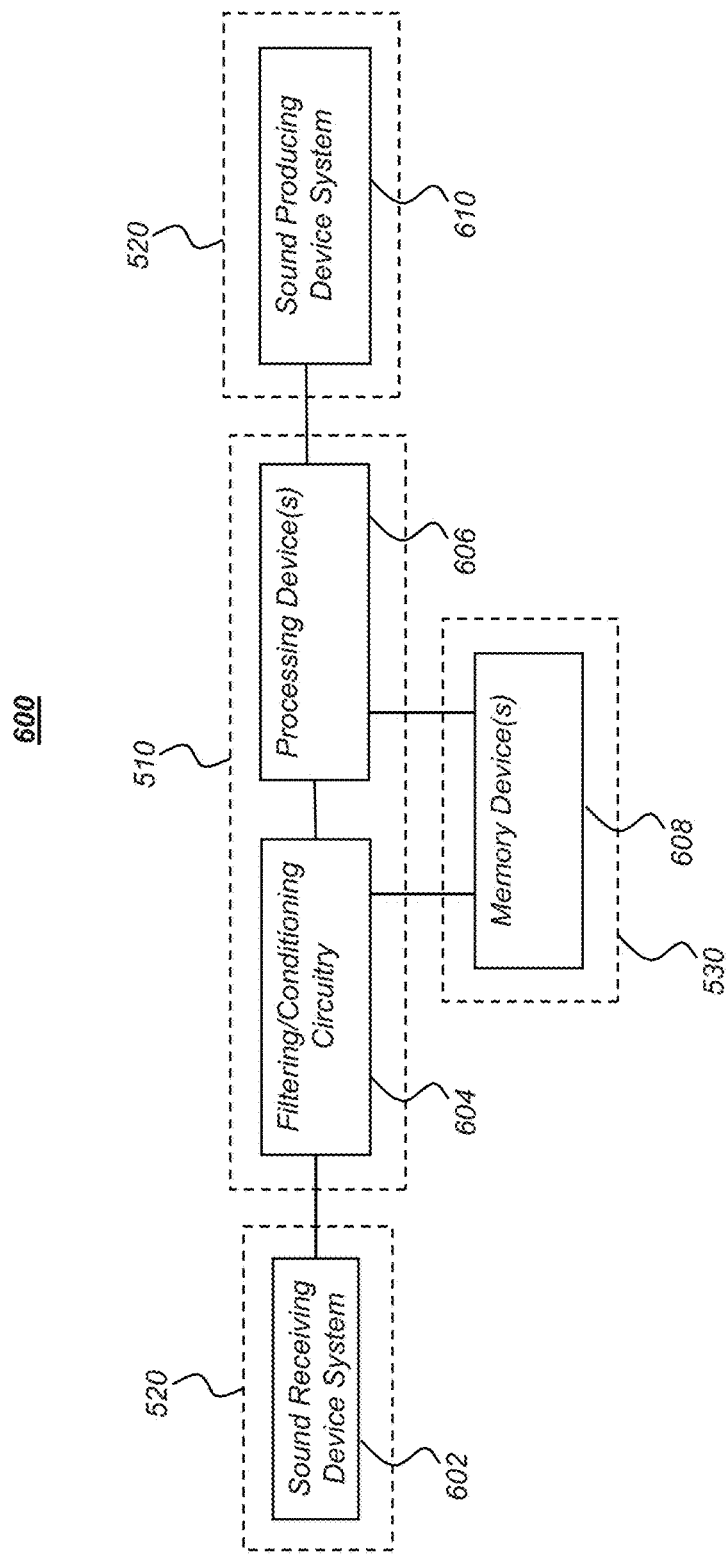
FIG. 6 illustrates a hearing aid device configured to fit within a human ear, according to some embodiments of the present invention.

In some embodiments, the system 500 is implemented as a hearing aid device 600 illustrated in FIG. 6 and configured to fit within an ear canal of a human ear. In this regard, the hearing aid device 600 may be considered a device system including multiple hardware components. According to some embodiments these hardware components may include a sound receiving (and recording) device system 602 configured to receive sound from outside the human ear and generate a corresponding input audio signal. The sound receiving device system 602 may include one or more microphones and any associated circuitry (e.g., an analog-to-digital ("ADC") converter) configured to generate the input audio signal from the received sound. In this regard, the sound receiving device system 602 may be considered at least part of the data input-output device system 520 in FIG. 5.

Although not required, the input audio signal from the sound receiving device system 602 may be subject to filtering or conditioning by filtering/conditioning circuitry 604. Such filtering or conditioning may include any preprocessing of the input audio signal to, for example, improve the signal-to-noise ratio (e.g., noise reduction preprocessing) of the input audio signal, provide gain to the input audio signal at least in frequency ranges where the user is experiencing hearing loss, or any other preprocessing (e.g., gain adjustment, speech-in-noise classification, phoneme classification, known in the art) suitable for facilitating the execution of negative rank ordering or scaling processing, according to various embodiments of the present invention, such as those described with respect to FIG. 7, below. Although the filtering/conditioning circuitry 604 is shown separately from the one or more processing devices 606 in FIG. 6, such circuitry may instead be implemented by the one or more data processing devices 606, according to some embodiments of the present invention. Alternatively, the filtering/conditioning circuitry 604 may be considered at least part of the sound receiving device system 602 as circuitry associated with one or more microphones and configured to generate the input audio signal.

The filtered/conditioned input audio signal from the filtering/conditioning circuitry 604 may be stored in one or more non-transitory memory devices 608 for accessing by the one or more processing devices 606 as the one or more processing devices 606 analyze the input audio signal and execute negative rank ordering or scaling of frequency under the direction of one or more control programs stored in the one or more memory devices 608. Examples of the processing performed by the one or more processing devices 606 are provided at least with respect to FIG. 7, discussed below. The filtering/conditioning circuitry 604 and the one or more processing devices 606 may be considered part of the data processing device system 510 in FIG. 5, and the one or more memory device(s) 608 may be considered at least part of the processor-accessible memory device system 530 in FIG. 5.

A result of the one or more processing devices 606 processing the input audio signal, including selectively performing negative rank ordering or scaling of frequency, is the generation of an output audio signal that is provided to a sound producing device system 610, which is configured to produce output sound, based upon the output audio signal, towards the user's ear drum that is better suited for speech recognition than the input sound. The sound producing device system 610 may include one or more speakers and associated circuitry (e.g., one or more digital-to-analog ("DAC") converters, amplifiers) configured to produce the output sound based upon the output audio signal from the one or more processing devices 606. In this regard, the sound producing device system 610 may be considered at least part of the data input-output device system 520 in FIG. 5.

Although not shown in FIG. 6, one or more internal power sources for the hearing aid device 600 are included to provide power to each of the hardware components 602, 604, 606, 608, and 610. Similarly, with respect to FIG. 5, one or more power sources are included to provide power to each of the hardware components 510, 520, and 530, although such one or more power sources are not shown in FIG. 5.

Figure 7:
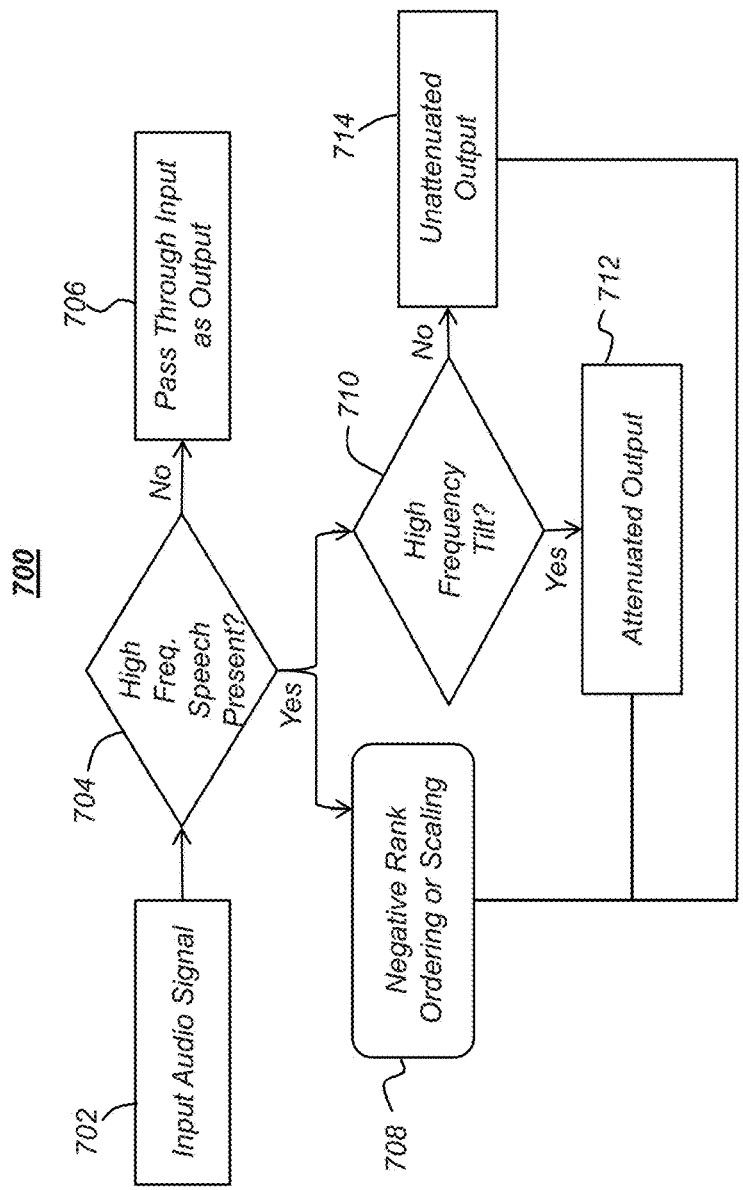
FIG. 7 illustrates a method for performing negative rank ordering or scaling of frequency on an input audio signal, according to some embodiments of the present invention.

FIG. 7 illustrates a method 700 for performing negative rank ordering or scaling of frequency on an input audio signal, according to some embodiments of the present invention. The method 700 may be executed by the system 500 in FIG. 5 or the system 600 in FIG. 6 according to one or more processor-executable programs stored in the processor-accessible memory device system 530, 608 executed at least by the data processing device system 510, 606. Stated differently, at least the data processing device system 510, such as the one or more processing devices 606, may be configured by one or more processor-executable programs stored in the processor-accessible memory device system 530, such as the one or more memory devices 608, to execute at least the method 700. Although the method 700 may be implemented at least by the data processing device system 510 or the one or more processing devices 606, the following description of method 700 will refer to the data processing device system 510 merely for ease of discussion. It should be noted, however, that the phrase "data processing device system 510" in the following description of method 700 may equivalently be replaced with a reference to the one or more data processing devices 606, according to some embodiments of the present invention. Further, the following discussions often describe characteristics of and operations performed on audio signals, such as an input audio signal or an output audio signal. In this regard, it is noted that such characteristics are embodied, and that such operations are performed on the respective audio signals in a state where the audio signals are embodied in a non-transitory computer-readable storage medium within the processor-accessible memory device system 530 or the one or more non-transitory memory devices 608.

At a fundamental level, according to some embodiments, the method 700 includes the data processing device system 510 receiving an input audio signal (e.g., according to program instructions associated with block 702) and generating, at least in some cases or at some point in time, an output audio signal (e.g., according to program instructions associated with block 712 or 714) at least by transposing and causing a negative rank ordering or scaling of frequency (e.g., according to program instructions associated with block 708) of at least a portion (e.g., one or more frequency ranges, one or more time segments, or both) of the input audio signal. In some embodiments, for example, the output audio signal is generated at least by transposing and causing a negative rank ordering or scaling of a high-frequency portion of the input audio signal, the high-frequency portion of the input audio signal becoming a low-frequency portion of the output audio signal. In this regard, the low-frequency portion of the output audio signal may represent an inverted ordering of frequencies present in the high-frequency portion of the input audio signal.

In some embodiments, the input audio signal received according to program instructions associated with block 702 may be the input audio signal output directly from the sound receiving device system 602 in FIG. 6 or, in embodiments where the filtering/conditioning circuitry 604 exists, may be the input audio signal as filtered or conditioned by the filtering/conditioning circuitry 604.

In embodiments employing the method 700, the input audio signal may be analyzed according to program instructions associated with block 704 to determine if high frequency speech is present in the input audio signal. In some embodiments, block 704 employs a frication detector to detect high-frequency aperiodic noise associated with the fricative, affricative, and stop consonant sound classes. However, the invention is not limited to any particular high-frequency speech detection, and any other high-frequency speech detection technique known in the art may be used for block 704. For example, a spectral balance detector or a more complicated analysis of modulation frequency and depth or a combination of parameters, or any other technique known in the art may be implemented for block 704. In addition, it should be noted that the processing associated with block 704 need not be implemented by the processing device(s) 606 in FIG. 6 and instead may be implemented by the filtering/conditioning circuitry 604, according to some embodiments of the present invention.

If a viable high-frequency speech pattern (e.g., frication) is identified in the input audio signal at block 704, processing may proceed at least to block 708 where negative rank ordering or scaling of frequency is performed on at least a portion (e.g., one or more frequency ranges, one or more time segments, or both) of the input audio signal. However, if a viable high-frequency speech pattern (e.g., frication) is not identified in the input audio signal at block 704, the input audio signal is passed through to the next stage of processing (e.g., the input audio signal may be merely passed through as the output audio signal to the sound producing device system 610 and FIG. 6) at block 706 and no negative rank ordering or scaling of the input audio signal is performed, according to some embodiments.

In this regard, the determination associated with block 704 may be considered a selector that continually analyzes the input audio signal and determines whether or not negative rank ordering or scaling of frequency is applied to various portions (e.g., frequency ranges, time segments, or both) of the input audio signal. For example, assume that the input audio signal is considered an input audio signal stream that is continually analyzed by the negative rank ordering or scaling selector of block 704, and the output audio signal generated by the data processing device system 510 based upon the input audio signal stream is an output audio signal stream. In this case, if the negative rank ordering or scaling selector of block 704 identifies a high-frequency speech pattern present in a first portion (e.g., one or more frequency ranges, one or more time segments, or both) of the input audio signal stream, the data processing device system 510 may generate, in response to the high-frequency speech pattern being identified as present in the first portion of the input audio signal stream, a first portion of the output audio signal stream (e.g., time period 404*b* of FIG. 4 and associated frequency range, where reference 404 represents an example output audio signal stream) at least by inverting the frequency ordering of at least part of the first portion of the input audio signal stream according to negative rank ordering or scaling performed at block 708. On the other hand, if the negative rank ordering or scaling selector of block 704 does not identify a viable high-frequency speech pattern present in a subsequent second portion (e.g., one or more frequency ranges, one or more time segments, or both) of the input audio signal stream, the data processing device system 510 may generate, in response to identifying that the speech pattern is not present in the second portion of the input audio signal stream, a subsequent second portion of the output audio signal stream (e.g., time period 404*c* and associated frequency range of FIG. 4) without inverting the frequency ordering of at least part of or any part of the second portion of the input audio signal stream according to the negative rank ordering or scaling of block 708.

In one specific example embodiment, the detector of block 704 is a spectral balance detector configured to compare the energy above 2500 Hz to the energy below 2500 Hz in the input audio signal. In this regard, negative rank ordering or scaling (e.g., block 708) occurs when the former is greater than the latter (i.e., the input is high-frequency dominated), which works well for speech in quiet. Analysis was carried out over successive windows (e.g., input audio signal stream time periods or segments) that were 5.8 ms in duration (i.e., 128 points at a 22,050-Hz sampling frequency). To prevent the switch of block 704 from being overly active, yet sensitive to rapid changes in high-frequency energy, there was a hysteresis to the switching behavior in this embodiment. In particular, spectral balance was computed from a weighted history of four successive windows, with the most recent window given the greatest weight (i.e., 0.4) and the most distant window given the least weight (i.e., 0.1). The reasoning is that if an intense, brief high-frequency sound (e.g., the 'burst' of energy associated with the release of air following the silent interval for stop consonants) was to pass through in the input audio signal, the switch of block 704 would trigger and that window and the one or two windows immediately following would be lowered, depending on the input. If a brief high-frequency noise sporadically occurred during a low-frequency dominated vowel, it might not be enough to trigger the switch at block 704, thereby normal processing (e.g., through to block 706) would be maintained. It should be noted, however, that the invention is not limited to the details of this embodiment, which is referred to for purposes of illustration only. Further, one or more aspects of this embodiment may be incorporated into other embodiments of the present invention.

In some embodiments, if the data processing device system 510 determines that there is useful high-frequency speech present in the input audio signal according to the instructions associated with block 704, the data processing device system 510 performs negative rank ordering or scaling of frequency according to any one of the various embodiments of the present invention to at least a portion (e.g., one or more frequency ranges, one or more time segments, or both) of the input audio signal according to the instructions associated with block 708.

In some embodiments, negative rank scaling associated with block 708 involves computing an instantaneous frequency ($F_{in}$) over the analysis band (e.g., the frequency range of the input audio signal where high-frequency speech is to be analyzed, e.g., the frequency range analyzed according to the instructions of block 704) by comparing the phase shift across successive fast Fourier transform (FFT) segments. Preserving phase, these components are reproduced at lower frequencies ($F_{out}$) using sine wave resynthesis, in these embodiments, in which output frequency is a reciprocal of input frequency as specified by the following formulae:

$$F_{out} = -\left(\frac{F_{in}^{-p}}{CompRange} \times outputBW\right) + baseline \quad \{Eq.\ 1\}$$

Where, "p" is the compression exponent, "CompRange" is the range of the compressed version of the input audio signal, e.g., the range of the inaudible region 401 of the input audio signal 403 in FIG. 4 expressed in terms of log frequency (e.g., scaled by the negative exponent p), "outputBW" is the bandwidth (range) of the output audio signal, and "baseline" shifts the intercept and moves the function from quadrant IV to quadrant I of the Cartesian plane. The net effect is that the reciprocal function (an example of a negative rank function) is scaled (e.g., compressed) so that the minimum input frequency ($minF_{in}$) becomes the maximum output frequency ($maxF_{out}$) and the maximum input frequency ($maxF_{in}$) becomes the minimum output frequency ($minF_{out}$):

$$CompRange = maxF_{in}^{-p} - minF_{in}^{-p} \quad \{Eq.\ 2\}$$

$$outputBW = maxF_{out} - minF_{out} \quad \{Eq.\ 3\}$$

$$baseline = \left(\frac{minF_{in}^{-p}}{CompRange} \times outputBW\right) + maxF_{out} \quad \{Eq.\ 4\}$$

In other words, in some embodiments, the data processing device system is configured, according to the program instructions associated with block 708, at least to generate the output audio signal at least by frequency inverting and compressing at least a portion (e.g., one or more frequency ranges, one or more time segments, or both) of the input audio signal. In this regard, the negative rank scaling includes an inversion of an ordering of frequencies present in the at least the portion of the input audio signal.

In some embodiments of the above-discussed negative rank scaling of block 708, the parameters used for such negative rank scaling were chosen following several small-scale pilot studies using normal-hearing listeners who each discriminated /s/ and /ʃ/ across almost 1200 trials. In these embodiments, the analysis band was intentionally limited to frequencies where the majority of frication energy is produced. At the low end of the range, $minF_{in}$ was set to 2756 Hz (a value that respects the FFT bin spacing). After some experimentation with higher values, the value chosen for $maxF_{in}$ was 7924 Hz. This experimentation was done in conjunction with setting the value for $minF_{out}$, which was ultimately chosen to be 200 Hz. $maxF_{out}$ is a variable parameter that is set to equal the maximum frequency for which aided audibility can be provided for the individual patient. Likewise, the compression exponent p is intended to be a parameter that is chosen for the individual patient. It is expected that values of p ranging from 0.25 to 2.5 should be sufficient for most patients, which will also depend on $maxF_{out}$. For example, during pilot studies in which $maxF_{out}$ was 1500 Hz, p=1.75 yielded the best performance not only for identification of /s/ and /ʃ/, but also for other consonants. (It should be noted, however, that the invention is not limited to the details of the embodiments (including the above discussed parameters) described above with respect to block 708, which are referred to for purposes of illustration only. Further, one or more aspects of these embodiments may be incorporated into other embodiments of the present invention.)

According to some embodiments of the present invention, the negative rank ordering or scaling of block 708 involves an inversion of an ordering of frequency segments or ranges from input-to-output, and not necessarily an inversion of an ordering of the individual frequencies within each segment. For a simple example, assume that a high-frequency region of the input audio signal 702 includes, from lowest-to-highest frequency, frequency sub-ranges or frequency sub-segments A and B. Frequency segment A, may include, from lowest-to-highest frequency, individual frequencies A1 and A2, and frequency segment B may include, from lowest-to-highest frequency, individual frequencies B1 and B2. Upon negative rank ordering or scaling of such an input audio signal, the low-frequency region of the output audio signal output from block 708 may include, according to some embodiments of the present invention, from lowest-to-highest frequency, the frequency segments B and A, or more specifically, may include the following sequence of individual frequencies, from lowest frequency to highest frequency: B1, B2, A1, and A2.

According to some embodiments of the present invention, an additional speech feature detector (e.g., in addition to the speech feature detector of block 704) may be implemented as part of the method 700. In some embodiments, this additional speech feature detector takes the form of block 710, which further classifies /s/ (high-frequency) from /ʃ/ (mid-frequency), for example.

Accordingly, when /s/ is detected (e.g., block 710), it may be beneficial to provide the user with an additional cue (e.g., block 712) to further distinguish /s/ from /ʃ/. This additional cue, according to some embodiments, is the providing of a differential gain (e.g., block 712) to help further segregate the two signals of origin on the basis of loudness. In other words, an additional perceptual cue may be provided (e.g., block 712) in the form of loudness (e.g., a differential gain) based on a phonemic classification of the speech (e.g., block 710). Such a differential gain may be applied after a gain has been applied to the input audio signal 702 by the filtering/conditioning circuitry 604 to amplify regions of frequency where the user is experiencing hearing loss. However, such a gain to frequency ranges where the user is experiencing hearing loss need not be separately applied, and may be applied in conjunction with the differential gain of block 712, according to some embodiments.

In some embodiments, the speech feature detector of block 710 may include the data processing device system 510 determining whether the spectral balance of a portion or time segment of the input audio signal includes a high-frequency tilt (e.g., exhibits higher energy at a high-frequency range as compared to a mid-frequency range), the portion/time segment having been identified according to the instructions associated with block 704 to include useful high-frequency speech. The high-frequency tilt detected according to the program instructions associated with block 710 facilitates the detection of /s/. However, it should be noted that any other type of speech feature detector may be executed at block 710.

According to some embodiments, in response to determining that the input audio signal exhibits the high-frequency tilt (e.g., exhibits the higher energy at the high-frequency range), the data processing device system 510, according to the instructions associated with block 712, attenuates a low-frequency range of the output audio signal, which was output from the negative rank ordering or scaling (e.g., output from block 708). The attenuation of the low-frequency range of the output audio signal may, in some embodiments, be relative to another frequency range or another time segment of the output audio signal. The attenuated low-frequency range of the output audio signal may correspond to the high-frequency range of the input audio signal that is negative rank ordered or scaled (e.g., inverted) according to the instructions associated with block 708. Stated differently, the attenuated low-frequency range of the output audio signal may correspond to the segment of the input audio signal that is frequency-lowered or transposed by the negative rank ordering or scaling performed according to the instructions of block 708. In other words, in some embodiments, the attenuated low-frequency range of the output audio signal includes the low frequency 408 in FIG. 4 and corresponds to the segment of the input audio signal including the high frequency 406 in FIG. 4. This attenuating of the low-frequency range of the output audio signal (e.g., output from block 708) may be to a greater extent than any attenuating of the output audio signal (e.g., output from block 708) at a frequency range other than the low-frequency range of the output audio signal (e.g., output from block 708). For example, while the low-frequency range of the output audio signal (e.g., including low frequency 408 in FIG. 4) is attenuated, the other frequencies of the output audio signal (e.g., including higher frequency 407 in FIG. 4) may not be attenuated, or at least may be attenuated to a lesser extent. In other words, the attenuation occurring according to the program instructions associated with block 712 may be a relative attenuation of the low-frequency range of the output audio signal as compared to another frequency range of the output audio signal. However, in some embodiments, the attenuation applied according to the program instructions of block 712 is an attenuation of the entire high frequency range of the input audio signal 702 that becomes frequency lowered by the negative rank ordering or scaling of block 708. In this regard, although /s/ and /ʃ/ have a peak energy at different frequencies, they are broadband and so have energy at overlapping frequencies in the input audio signal (therefore, in the output audio signal output from block 508 also). (See, e.g., FIG. 11(a) and FIG. 11(b), which are discussed in more detail below. In FIG. 11(a) and FIG. 11(b), it can be noticed how the spectral content after lowering (e.g., block 708) overlaps (as it does before lowering), but how the overall energy in the region of greatest overlap is less for /s/ (FIG. 11a) than for /ʃ/ (FIG. 11b).) In this regard, in some embodiments, the program instructions associated with block 712 add an addition perceptual cue to help the user or listener to distinguish /s/ from /ʃ/.

While the above discussion of block 712 pertains to attenuation of the output audio signal, it should be noted that the present invention also includes applying a gain (or less of a gain in some embodiments) to at least a portion or frequency range of the output audio signal (e.g., output from block 708) at block 712, for example, instead of or in addition to attenuating a portion or frequency range of the output audio signal (e.g., output from block 708). For example, in some embodiments, the attenuation of block 712 is instead a differential gain, such that program instructions associated with block 712 cause or configure the data processing device system 510 to apply a gain to the low-frequency range of the output audio signal (e.g., including frequency 408 in FIG. 4) that is to a different extent than a gain applied to another or any other frequency range of the output audio signal (e.g., including frequency 407 in FIG. 4). For instance, the data processing device system 510 may apply less of a gain to the low-frequency range of the output audio signal than that applied to the other frequencies of the output audio signal. Alternatively, the data processing device system 510 may apply no gain or an attenuation to the low-frequency range of the output audio signal according to the instructions of block 712, while applying a gain to the other frequencies of the output audio signal. In this regard, it can be seen that the present invention is not limited to any particular combination of gains, attenuations, or one or more gains and one or more attenuations applied according to the program instructions associated with block 712.

In this regard, in some embodiments, the data processing device system 510 may be configured by program instructions associated with block 712 to cause, by way of at least a gain, an attenuation, or both a gain and an attenuation, and in response to determining that the input audio signal exhibits the higher energy at the high-frequency range at block 710, a low-frequency range of the output audio signal to be relatively de-emphasized or emphasized as compared to another frequency range or another time segment of the output audio signal in order to provide a user or listener with an additional perceptual cue to distinguish similar sounds. The low-frequency range of the output audio signal may correspond, prior to the negative rank ordering or scaling of block 708 (which may be a frequency inversion, according to some embodiments) of the input audio signal, to the high-frequency range of the input audio signal.

Further, although attenuation, gain, or both, has been discussed as being applied according to the instructions associated with block 712 to the audio signal output from block 708, it should be appreciated that such attenuation, gain, or both may instead be applied to the input audio signal (e.g., just upstream of block 708) prior to performing negative rank ordering or scaling according to the instructions associated with block 708. For example, blocks 710 and 712 could selectively de-emphasize/emphasize the high-frequency range (e.g., including the frequency 406 in FIG. 4) of the input audio signal (e.g., at a point exiting block 704 in FIG. 7), such that the high-frequency-de-emphasized (or emphasized) input audio signal is passed to block 708 for negative rank ordering or scaling. In this regard, it may be said that, in response to determining that the input audio signal contains a particular sound (e.g., exhibits higher energy at the high-frequency range (e.g., pursuant to block 710), such as /s/), an output audio signal is generated to include a perceptual cue (e.g., pursuant to block 708) to distinguish the particular sound from a similar sound (e.g., having overlapping frequencies with the particular sound, such as /s/ and /ʃ/) at least by applying a differential gain, a differential attenuation, gain, an attenuation, or a combination of one or more gains and attenuations to at least a portion or frequency range of the input audio signal in order to relatively de-emphasize or emphasize the high-frequency range of the input audio signal. If a differential gain or a differential attenuation is applied to the input audio signal in this regard, the gain or attenuation applied to the high-frequency range of the input audio signal (e.g., including the frequency 406 in FIG. 4) is to a different extent than any gain or attenuation applied to the input audio signal at a frequency range or all other frequencies (e.g., including frequency 410 in FIG. 4) other than the high-frequency range of the input audio signal.

In consideration of the selective nature of the de-emphasizing/emphasizing process of blocks 710 and 712, it should be noted that if the input audio signal 702 is considered an input audio signal stream, block 712 may add the perceptual cue only when the speech feature detector of block 710 detects its target sound or phoneme (e.g., /s/).

In some embodiments where the speech feature detector of block 710 detects high frequency tilt in order to detect a target sound or phoneme, in response to the data processing device system 510 identifying, according to the program instructions associated with block 710, that a first time segment of the input audio signal stream exhibits higher energy at a high-frequency range as compared to a mid-frequency range (e.g., the target sound or phoneme has been detected), the data processing device system 510 may cause, by way of at least a gain, an attenuation, or both a gain and an attenuation according to program instructions associated with block 712, a low-frequency range of a first portion or time segment of the output audio signal stream to be emphasized or de-emphasized as compared to another frequency range of the first portion or time segment of the output audio signal stream or as compared to another time segment of the output audio signal stream. In some embodiments, the low-frequency range of the first portion or time segment of the output audio signal stream corresponds, prior to the negative rank ordering or scaling of block 708 (which may be an inverting) of the first portion of time segment of the input audio signal stream, to the high-frequency range of the first portion or time segment of the input audio signal stream. Such emphasizing or de-emphasizing may add a perceptual cue to further distinguish the detected target sound or phoneme (e.g., block 710) from a sound that is similar (e.g., shares similar frequency characteristics so as to be typically confused by a listener) to the detected sound.

On the other hand, in some embodiments, if the data processing device system 510 identifies, according to the program instructions associated with block 710, that a different time segment of the input audio signal stream exhibits higher energy at the mid-frequency range as compared to the high-frequency range (e.g., the target sound or phoneme has not been detected), the data processing device system 510 does not cause emphasizing or de-emphasizing according to block 712 of the high-frequency range of the input audio signal present in the low-frequency range of the output audio signal. Consequently, in this case, the data processing device system 510 does not apply, according to some embodiments of the program instructions associated with block 712, a differential gain, a differential attenuation, a gain, an attenuation, or a combination of one or more gains and attenuations, to at least a portion or frequency range of the different time segment of the input audio signal or a portion or time segment of the output audio signal corresponding to the different time segment in order to relatively emphasize or de-emphasize the high-frequency range of the input audio signal, according to some embodiments. In other words, the perceptual cue of block 712 is not added in this case when the target sound or phoneme is not detected. In this regard, according to some embodiments, in response to determining that the input audio signal 702 does not contain a target sound or phoneme (e.g., does not exhibit the high-frequency tilt) at block 710, the data processing device system 510 does not perform the cue adding (e.g., differential gain) of block 712 of the low-frequency range of the output of the negative rank ordering or scaling block 708. See, e.g., block 714.

The sound detection and cue adding processes of blocks 710 and 712 provide an additional cue to the user for distinguishing between signals that are lowered and exist within similar frequency regions. Consequently, the sound detection and cue adding processes of blocks 710 and 712 may be active at all times (e.g., constantly analyzing the input audio signal to determine whether a target sound or phoneme exists and whether the cue-adding of block 712 should be applied). In some embodiments, such cue adding of block 712 is to be distinguished from applications of differential gain that merely make sounds in the regions of greater hearing loss louder than the rest of the signal (such a differential gain may be applied by the filtering/conditioning circuitry 604). In contrast to such a differential gain, the differential gain of block 712 adds a perceptual cue to distinguish similar sounds and may be applied after the differential gain that makes sounds in the regions of greater hearing loss louder than the rest of the signal. In this regard, the differential gain of block 712 that adds the perceptual cue is being applied independently or regardless of frequency regions where hearing loss is occurring for the user. Further in this regard, although the above discussion of blocks 710 and 712 focused on facilitating distinguishing the phonemes /s/ and /ʃ/, it should be noted that blocks 710 and 712 may also be adapted to facilitate distinguishing other similar phonemes, according to some embodiments of the present invention.

Although the determination of whether a target sound or phoneme exists according to the instructions associated with block 710 has been described as applying to the input audio signal from blocks 702, 704, the present invention is not limited to this arrangement. In some embodiments, block 710 operates on the output audio signal output from block 708. In at least some of these embodiments, the program instructions associated with block 710 are instead configured to determine whether a target sound or phoneme (e.g., by way of a low-frequency tilt) exists in the output audio signal output from block 708. If so, the low-frequency portion or range of the output audio signal may be emphasized or de-emphasized according to the instructions associated with block 712 as previously discussed. If not, the emphasizing or de-emphasizing performed according to the instructions associated with block 712 is not executed, as illustrated by block 714.

As to some of the reasoning associated with performing the differential gain (which may include an attenuation) according to the instructions associated with block 712, it is noted that the relative level of the entire frequency-lowered segment according to the negative rank ordering or scaling of block 708 depends on the spectral balance of the input audio signal. An intent is to enhance the perceptual dissimilarity of speech sounds with frication that is produced toward the front of the mouth, which creates a peak of energy in the high frequencies (e.g., /s/) from speech sounds with frication that is produced further back in mouth, which creates a peak of energy in the mid frequencies (e.g., /ʃ/). An empirical examination of /s/ and /ʃ/ recordings in three vowel-consonant-vowel contexts (/a/, /i/, and /u/) from three adult male and three adult female talkers was used to optimize, according to some embodiments, the analysis at block 710 by the data processing device system 510 based on spectral balance. In this regard, in some embodiments, the data processing device system 510 is configured to compare the band-pass filtered energy of the input audio signal segment from 2500-4500 Hz to the high-pass filtered energy above 4500 Hz.

In some of these embodiments, if the energy of the input audio signal segment at block 710 from 2500-4500 Hz is greater than the energy above 4500 Hz, at least the frequency-lowered segment of the output audio signal from block 708 is passed through to the next stage of processing (e.g., at block 714 to the sound producing device system 610 in FIG. 6) without differential gain (e.g., attenuation) of the frequency-lowered segment according to block 712.

On the other hand, according to some embodiments, if the energy of the input segment above 4500 Hz is greater than the energy from 2500-4500 Hz, the frequency-lowered segment is subject to differential gain (e.g., attenuated) at block 712 before being passed through to the next stage of processing (e.g., to the sound producing device system 610 in FIG. 6). In some embodiments, block 712 may involve an attenuation of 4-9 dB. In this regard, it should be noted that a small group of pilot studies with a larger difference (10 dB) and smaller difference (3 dB), did not yield comparable outcomes as a 6 dB difference. It should also be noted that, although the above discussion refers to the particular range of 2500-4500 Hz for block 710 and 4-9 dB of attenuation for block 712 in some embodiments, the present invention is not limited to these particular ranges, and different applications may be better suited for other ranges. The ranges provided herein are merely for purposes of illustration and to provide examples that may be suitable for some particular applications of many applications to which the present invention may be applied.

In this regard, it is noted that in some embodiments, at least four parameters implemented in the method 700 may be adjustable to accommodate differences between individuals:

(1) the upper frequency limit of the output, $\max F_{out}$ (e.g., block 708);
(2) the compression exponent, p (e.g., block 708);
(3) the overall level of the frequency-lowered segments (e.g., blocks 712 and 714) relative to the un-lowered segments (e.g. block 706); and
(4) the relative level difference of the added level cue (e.g., block 712).

Figure 8:
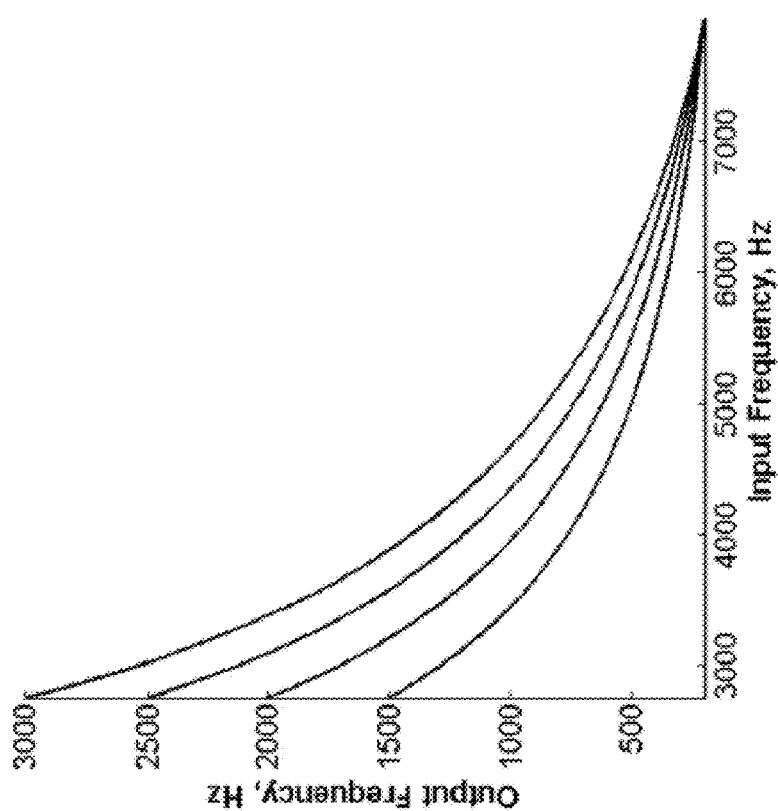
FIGS. 8-10 illustrate negative rank ordering or scaling of frequency I/O functions, according to some embodiments of the present invention.

The upper frequency limit of the output, $\max F_{out}$ (parameter (1), above), in some embodiments, is set equal to the maximum audible frequency based on the individual's hearing loss. That is, the bandwidth of the output may be set equal to the bandwidth of the audible spectrum (while this seems logical, it is not typically a consideration of many other methods). FIG. 8 shows how $\max F_{out}$ may be set, according to some embodiments, for hearing losses in which audibility drops off at 1500, 2000, 2500, and 3000 Hz. As can be seen in FIG. 8, increasing $\max F_{out}$ shifts the overall function vertically toward the perceptual space for /ʃ/, but will expand it since the acoustic differences between the output for /s/ and /ʃ/ will be greater. How this shift will affect perception will depend on the individual. Therefore, to maximize the discriminability of /s/ and /ʃ/, the compression exponent, p (parameter (2), above), may be variable to accommodate differences in perception between individuals. An assumption is that improvement in discrimination for this sound contrast will also improve discrimination of other sound contrasts.

Figure 9:
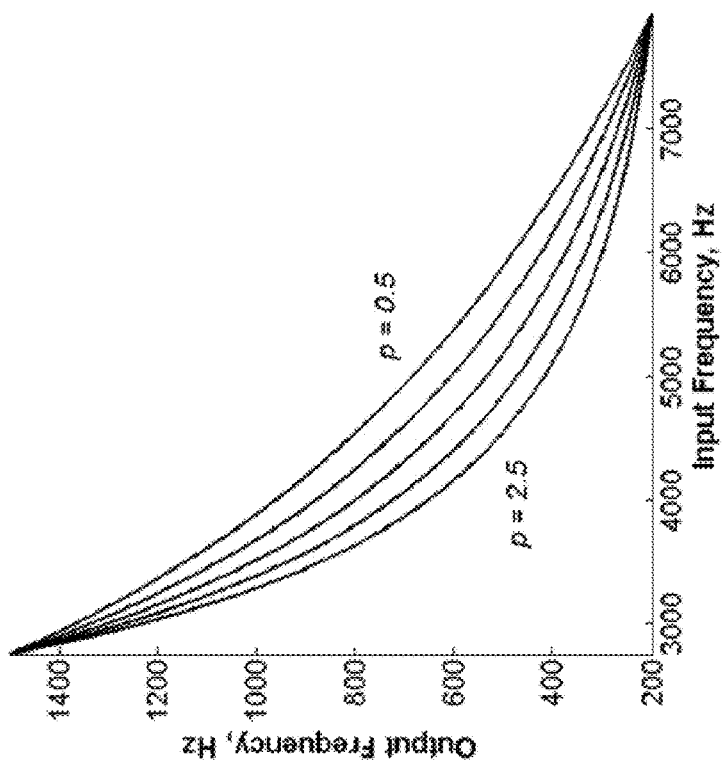
Figure 10:
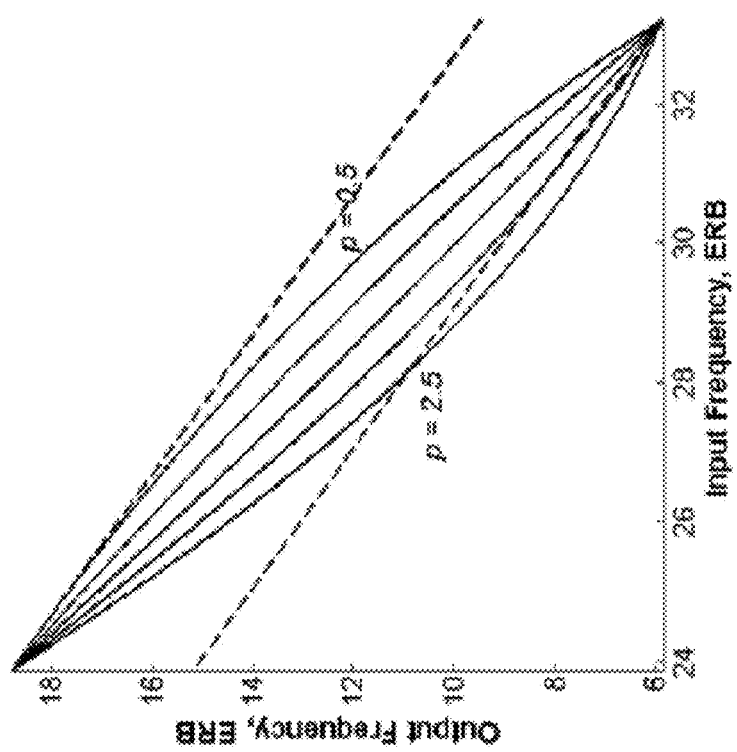

In general, a higher value (i.e., more compression) should increase the perception of /s/, while a lower value (i.e., less compression) should increase the perception of /ʃ/. FIG. 9 shows the I/O functions for p=0.5 to p=2.5. While, the functions in FIG. 9 appear to be very compressive when plotted on a linear Hertz scale, one must consider that filtering in the inner ear is logarithmic. FIG. 10 plots the same functions on a psychophysical scale (the ERB (equivalent rectangular bandwidth)) in which the numbers correspond to independent auditory filter bands (See, e.g., Glasberg, B. R., and Moore, B. C. J. (1990), "Derivation of auditory filter shapes from notched-noise data," Hear Res 47, 103-138). When plotted this way, the functions are only moderately nonlinear, and in fact, are expansive (slope<−1.0), rather than compressive. This occurs because the analysis band, in these embodiments, was restricted to 2756-7924 Hz, or about 9.5 ERB. In contrast, even with $\max F_{out}$ set as low as 1500 Hz, the output band is at least 13 ERB wide. That is, spectral resolution (the ability to distinguish peaks close together in frequency) of the lowered signal is greater than that of the original input signal.

Other adjustable parameters of the method 700 are the overall level of the frequency-lowered segments relative to the un-lowered segments (parameter (3), above) and the relative level difference of the added intensity cue (parameter (4), above). The overall level may simply be adjusted to balance perceptual salience (i.e., the ability to perceive the cue) and distractibility (i.e., complaints of the cue being 'too noisy' or 'too unnatural'). The purpose of including relative level difference as an adjustable parameter is to account for the fact that hearing aids will usually compress output level to fit the wide dynamic range of input level into the narrower dynamic range of the hearing loss so that lower level sounds receive greater gain than higher level sounds. The relative intensity cue might be adjusted automatically to account for this reduction in dynamic range (i.e., the size of the level cue) or might be adjusted based on a brief perceptual testing that attempts to find the parameters that maximize /s/-/ʃ/ discrimination.

In some embodiments, regarding parameter (3), above, the output of block 714 was attenuated, relative to the output of block 706, by 2 to 4 dB (from its original bandpass input level), whereas the output of block 712 was another 8 to 10 dB lower. That is, both the output of block 712 and the output of block 714 was attenuated, in these embodiments, relative to their original bandpass level present in the input audio signal 702. However, in these embodiments, the output of block 712 was attenuated more than the output of block 714. Subsequent to this attenuation, hearing aid gain was then applied to both outputs to accommodate individual hearing loss, according to these embodiments. The perceptual reason for this is that even for normal-hearing listeners a low-frequency sound will be perceived as louder than a high-frequency sound of the exact same intensity. So, if the overall intensity of the lowered /s/ and /ʃ/ (and other high-frequency speech sounds) are kept the same, they will sound loud relative to how a listener is used to hearing them. To help keep the perceptual balance, these embodiments simply turn the volume of the lowered speech down. This phenomenon will vary between listeners, especially those who have never heard these high-frequency sounds before and who have no basis for judging how loud they should sound. In this regard, listeners might want them louder so that they are better able to perceive them.

FIRST COMPARATIVE EXAMPLES

Figure 11:
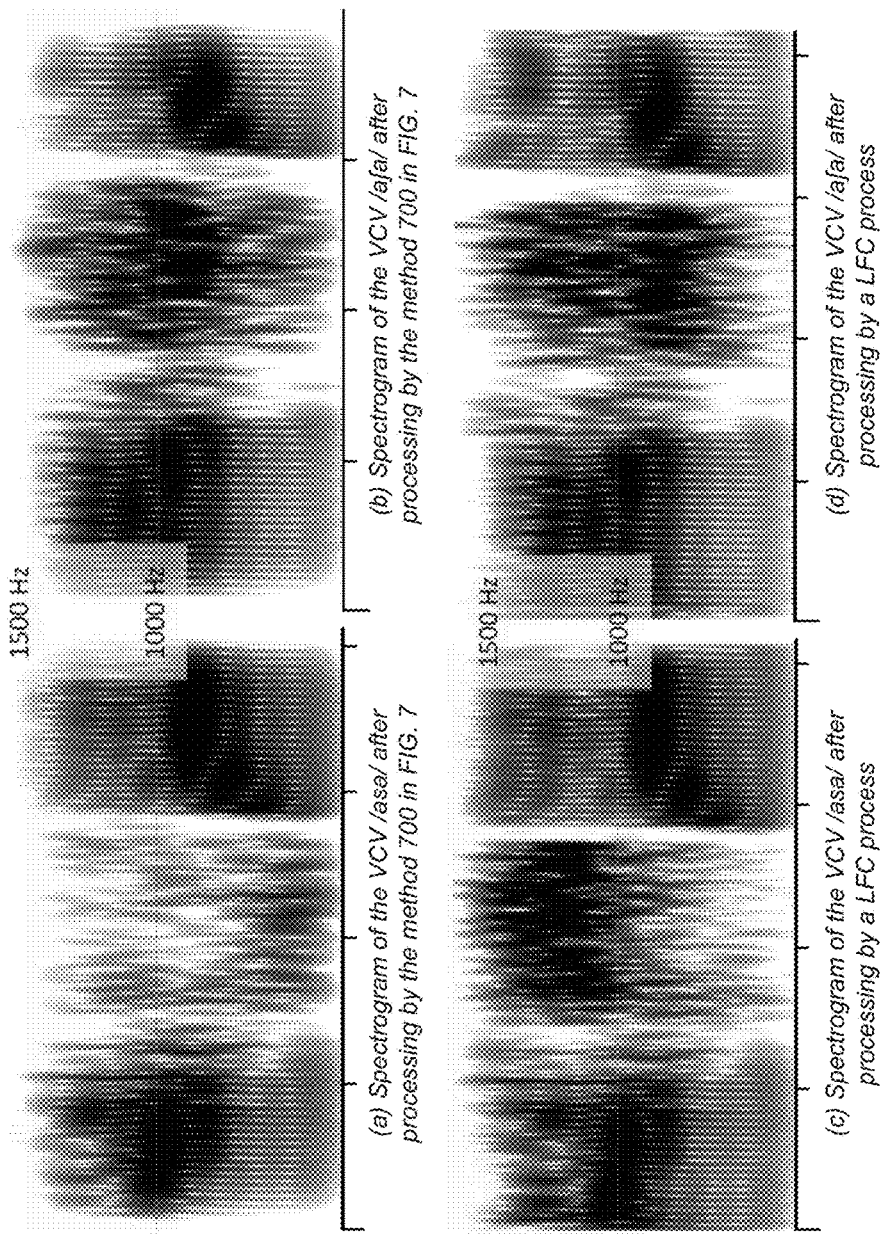

FIG. 11 compares spectrograms of the vowel-consonant-vowels ("VCVs") /asa/ and /aʃa/ after negative rank ordering or scaling processing according to the method 700, with maxF$_{out}$=1500 Hz, p=1.75, and level cue (e.g., attenuation according to block 712)=6 dB, as shown in FIG. 11(a) and FIG. 11(b), respectively, to processing with a simulation of a conventional linear frequency compression ("LFC") technique as shown in FIG. 11(c) and FIG. 11(d). While /ʃ/ is grossly similar with the two methods (FIG. 11(b) and FIG. 11(d)), /s/ shows a more drastic difference. With negative rank ordering or scaling of frequency (e.g., block 708) and application of differential gain (e.g., block 712), the energy for /s/ (FIG. 11(a)) is less intense and is concentrated toward the lowest frequencies, which makes it rather distinct from /ʃ/ (FIG. 11(b)). In contrast, with linear frequency compression, the energy for /s/ (FIG. 11(c)) is concentrated toward the highest end of the output range and is less distinct from /ʃ/ (FIG. 11(d)). Furthermore, the energy for /s/ in FIG. 11(c) is in the region most listeners perceptually categorize as /ʃ/, which should make it more difficult to relearn when acclimatizing to the new speech code.

SECOND COMPARATIVE EXAMPLES

Figure 12:
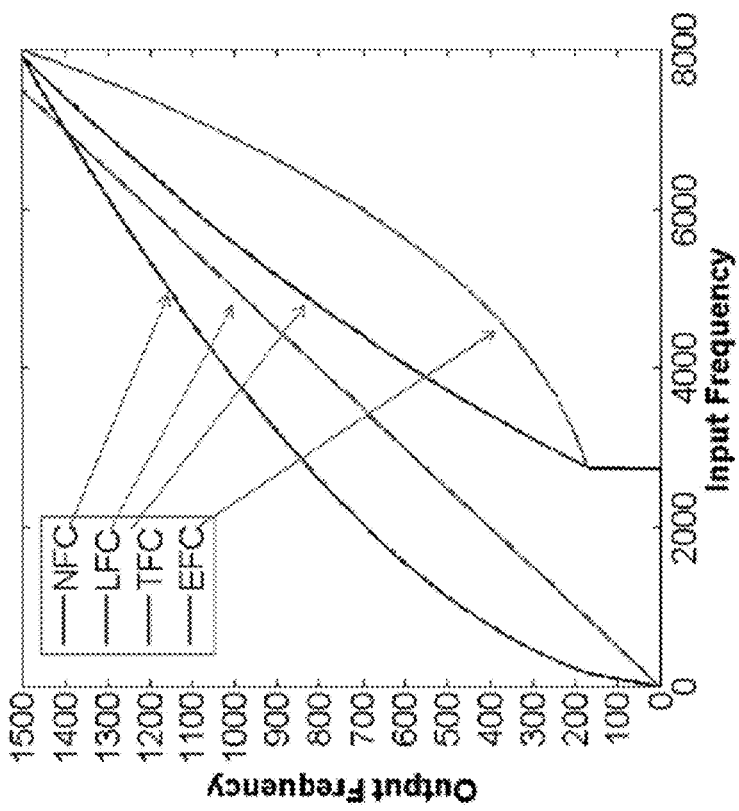
Figure 13:
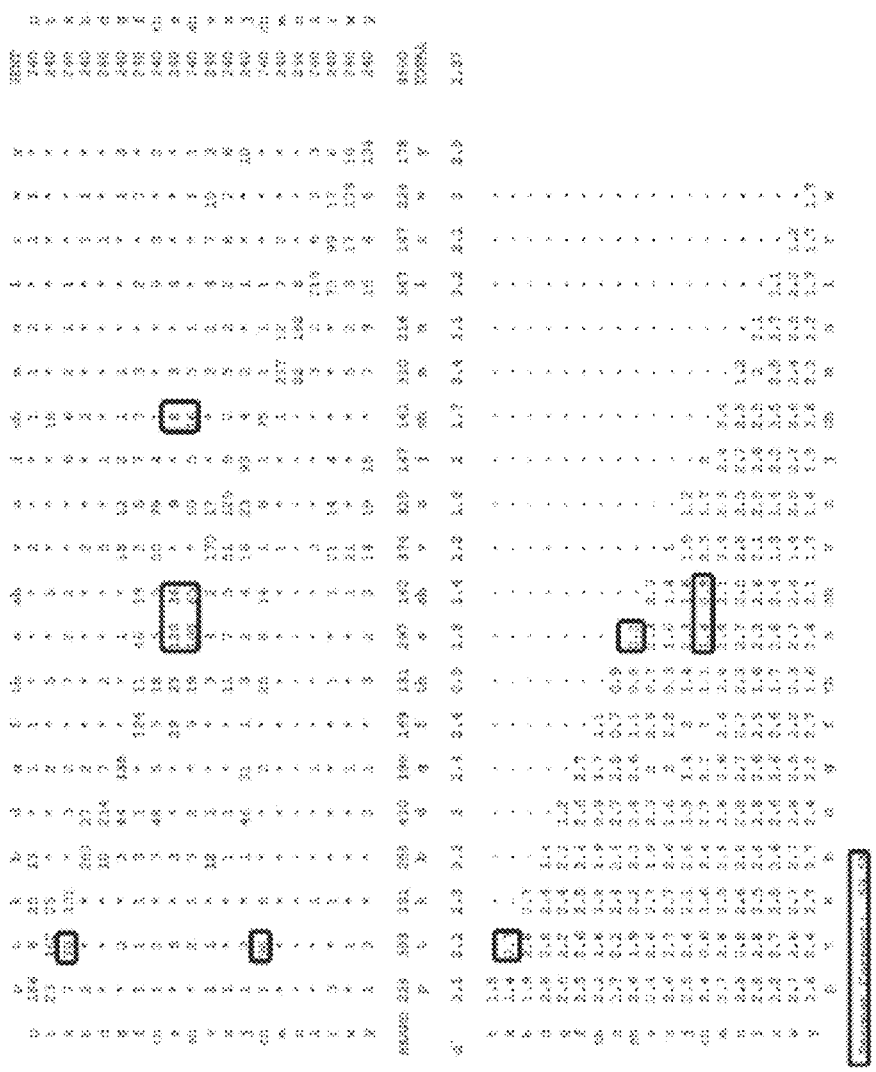

A basis of comparison for evaluating the performance of the method 700 in FIG. 7 are a series experiments reported by Shames and Alexander (Shames, Y. A., and Alexander, J. M. (2011), "Novel dynamic frequency lowering techniques for precipitous hearing loss," American Auditory Society (Abstract)) in which a variety of positive rank scaling methods of frequency lowering, including a 1500-Hz low-pass filtered condition, were tested on 20 normal-hearing listeners each who identified 240 VCVs (20 consonants spoken by four talkers in three vowel contexts) and 144 nonsense syllables differing only in the medial vowel (12 vowels spoken by 12 talkers). Frequency lowering for all conditions was dependent on the spectral balance of the input, using the method of block 704. The frequency I/O functions for the methods reported on are shown in FIG. 12. Each was tested with and without an added level cue (5 dB) from block 710. In general, overall performance was better with the added level cue (block 710) regardless of frequency-lowering method, so these are the only results reported. The LFC line in FIG. 12 is the frequency mapping representing the linear frequency compression technique (LFC). The NFC line represents nonlinear frequency compression (NFC) using the equation described by Simpson et al. (Simpson, A., Hersbach, A. A., & McDermott, H. J. (2005), "Improvements in speech perception with an experimental nonlinear frequency compression hearing device," Int J Aud 44, 281-92). The TFC (truncated frequency compression) line represents the same, except with an analysis band that was truncated to 2756-7924 Hz, which the same range as shown in FIG. 9 for one embodiment of negative rank ordering or scaling of frequency. Finally, the EFC (expanded frequency compression) line represents an alternative mapping in which high-frequency inputs were assigned a relatively expanded frequency space in the output. Results for each are shown in FIGS. 13-18.

The top part of each of FIGS. 13-18 shows the stimulus-response matrix where the rows represent the consonant stimuli that were presented and where the columns represent the responses aggregated over 20 listeners. Thus, numbers along the diagonal are correct responses and numbers along the off-diagonal are incorrect responses. As can be seen from Table 1 in FIG. 13, severely band-limited speech results in a high number of confusions of /ʃ/ for /s/. Other notable confusions within the context of the current set of experiments are /t/ for /tʃ/ and /t/ for /k/. The bottom part of each of FIGS. 13-18 shows the d-prime (d') for each consonant overall and for each pair of confusions. The advantage of d' is that it takes into account false alarms as well as hits (Macmillan, N. A. and Creelman, C. D. (2005), "Detection theory: A user's guide," 2nd Ed. (Erlbaum, N.J.)). For example, if stimulus A is always perceived correctly, but stimulus B is also always perceived as stimulus A, then the listener is not sensitive to the contrast (d'=0), despite being 100% correct for stimulus A. Thus, d'=0.2 for the /s/-/ʃ/ contrast in Table 1 of FIG. 13 reflects the high number of confusions of /ʃ/ for /s/.

Figure 14:
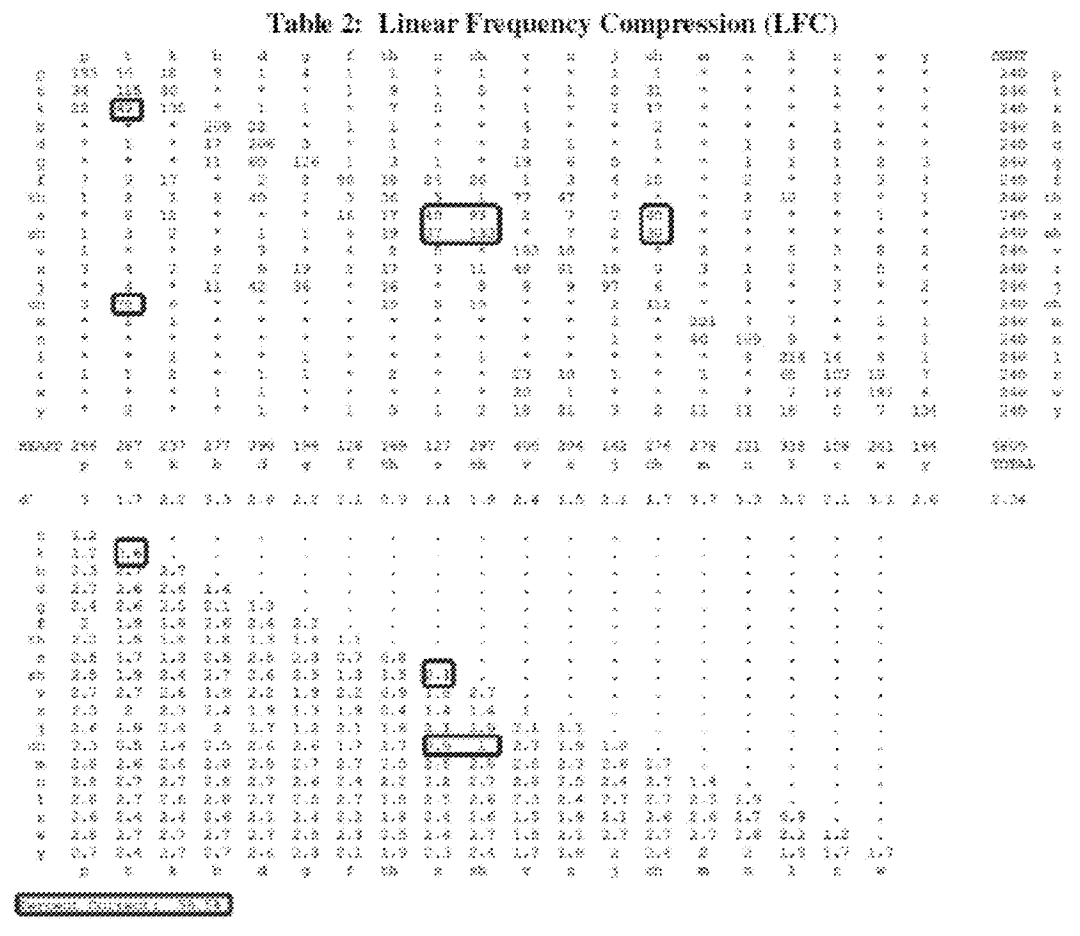

Table 2 of FIG. 14 shows the results for a simulation of linear frequency compression. Interestingly, while there was a doubling in the number correct responses for /ʃ/, this came at the expense of a tripling in the number of confusions of /ʃ/ for /s/, hence there was no improvement for d' for this contrast. Similarly, while the number of confusions of /t/ for /k/ was reduced, so was the number of correct responses for /t/, thus there was no improvement in d'. Finally, there was an overall in increase in the number of confusions of /tʃ/ for both /s/ and /ʃ/.

Figure 15:
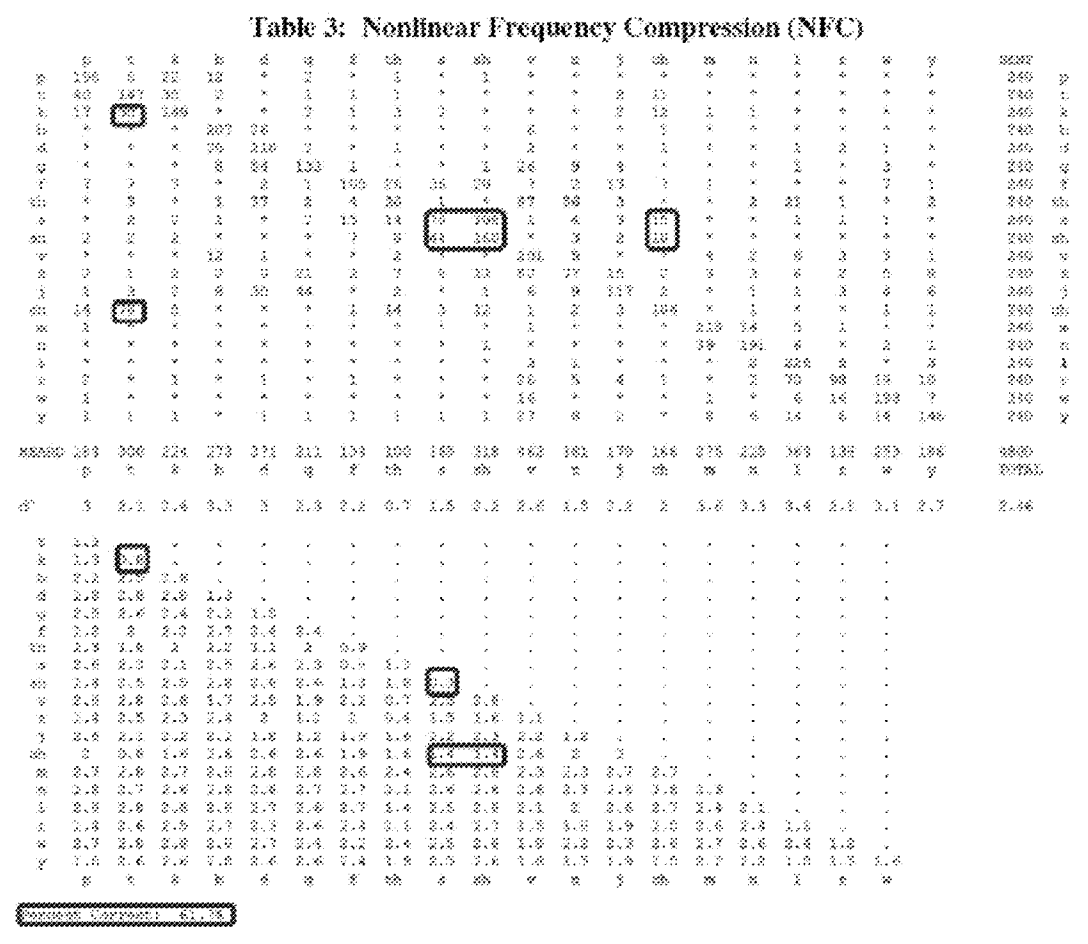

Table 3 of FIG. 15 shows the results for nonlinear frequency compression, which fared a little better than linear frequency compression. This was especially true for the number of correct /s/ and /ʃ/ responses, which increased without much of an increase in the number of /s/-/ʃ/ confusions. Also, relative to linear frequency compression, there was a modest increase in the number of correct /t/ and /k/responses with a similar number of confusions between the two methods. Finally, unlike linear frequency compression, there were a low number of confusions of /tʃ/ for /s/ and /ʃ/.

Figure 16:
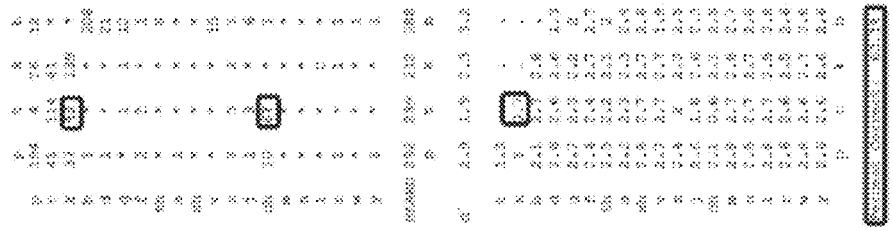

Table 4 of FIG. 16 shows the results for truncated (nonlinear) frequency compression. Relative to the other frequency-lowering methods, the most notable pattern is the significant increase in the number of /ʃ/ responses for both /s/ and /ʃ/ stimuli.

Figure 17:
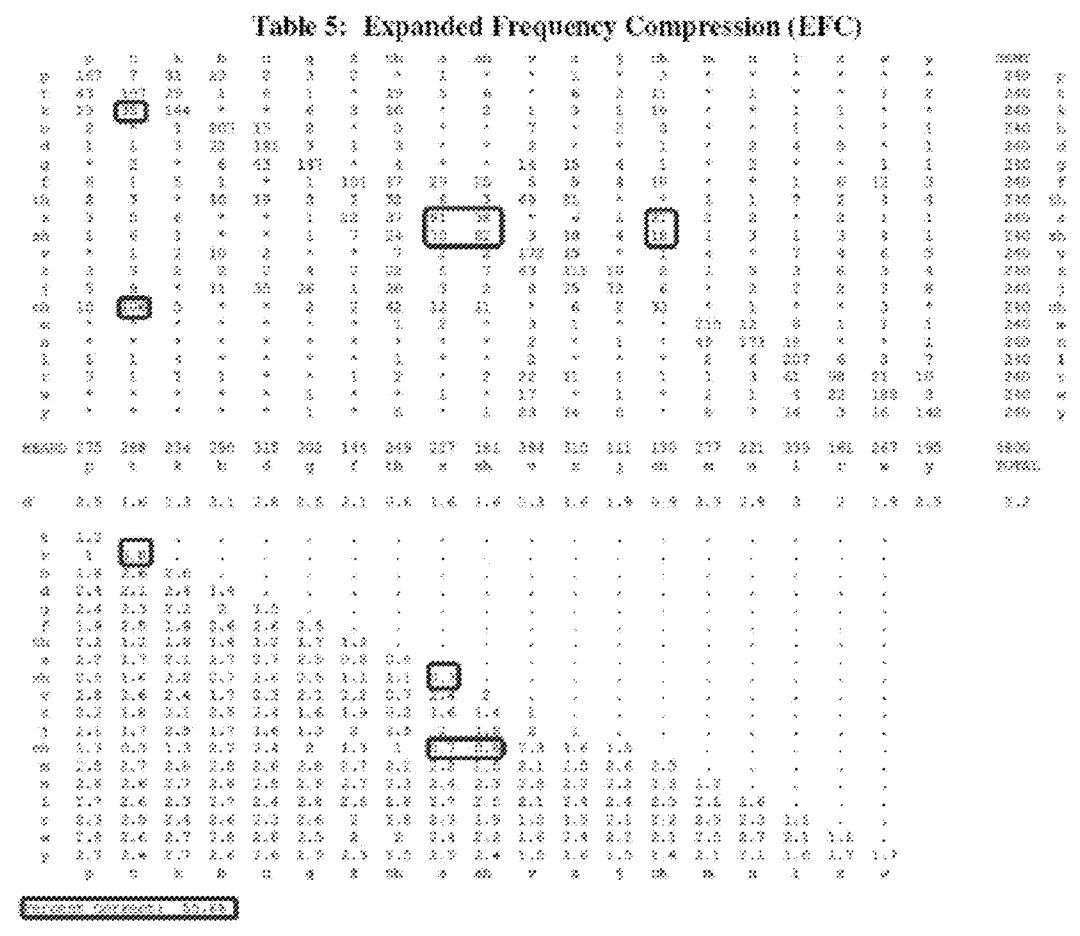

Table 5 of FIG. 17 shows the results for expanded (nonlinear) frequency compression. While perception of /s/ and /ʃ/ was more balanced than the previous experiments, overall percent correct with this method was lowest of all. In addition, compared to the other frequency lowering methods, there were a significant number of /t/ confusions for /tʃ/ and only ⅓ to ¼ the number of correct /tʃ/ responses.

Figure 18:
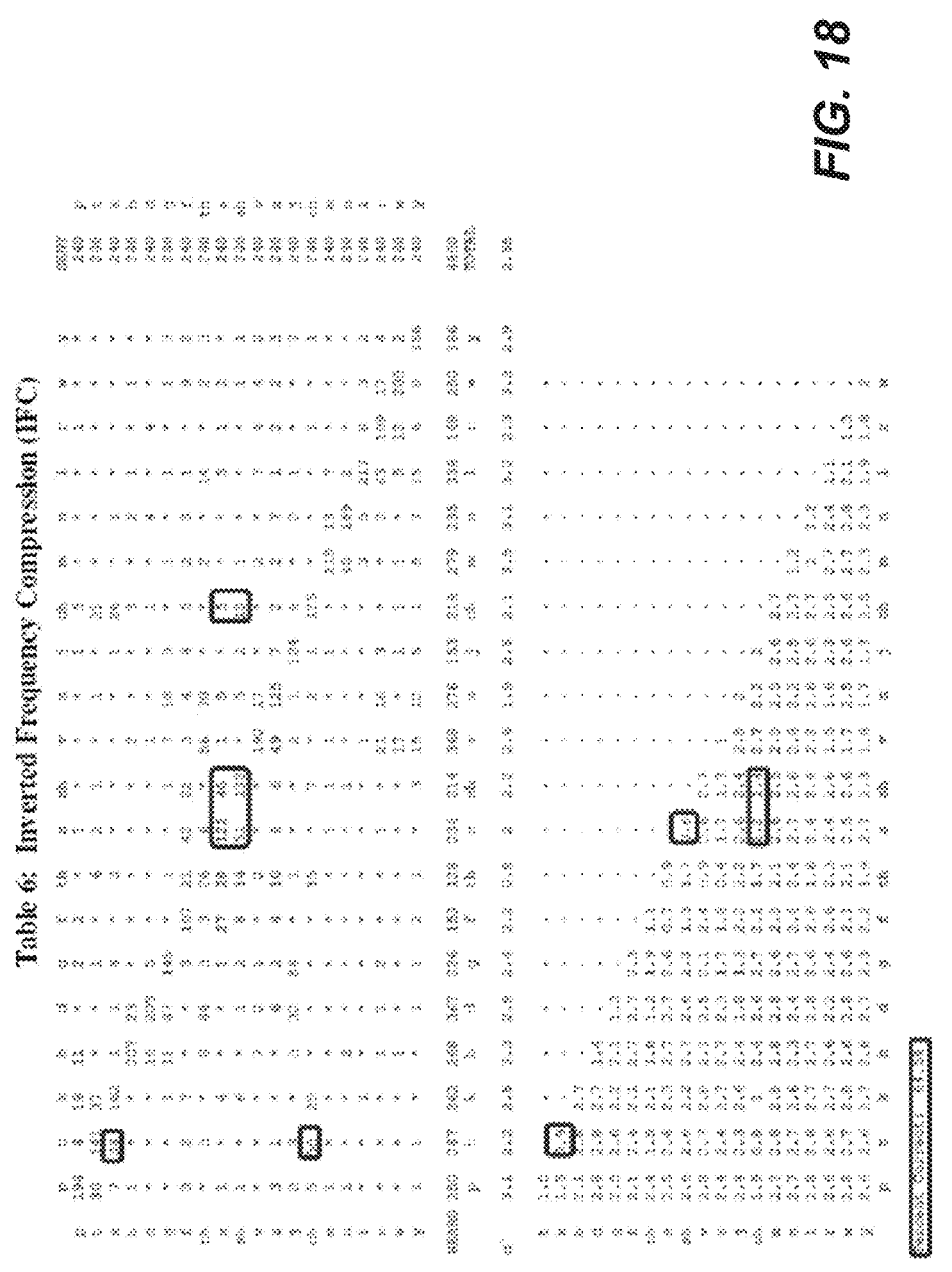

Table 6 of FIG. 18 shows the results for the method 700 of FIG. 7, also referred to as inverse frequency compression ("IFC"), according to some embodiments. The first aspect to note is that overall percent correct is the highest of all other methods tested. In addition, d' for the /s/-/ʃ/, /t/-/k/, and /ʃ/tʃ/ contrasts were the highest of all tested methods, among others. For the /s/-/ʃ/ contrast, the number of correct responses are balanced (i.e., unbiased) with a relatively modest number of confusions between the two and with a minimal number of confusions with /tʃ/. If the overall d' for IFC for each of the consonants is compared to LFC, not only is there improvement (here, defined as a d' difference≥0.2) for /s/ and /ʃ/, but also for other phonemes, including /t/, /k/, /z/, /d₃/, /tʃ/, and /j/. Compared to low-pass filtering, improvements with IFC are seen for half of the consonants: /k/, /Θ/, /s/, /ʃ/, /v/, /j/, /tʃ/, /r/, /w/, and /y/.

Finally, because each of the tested methods implemented frequency lowering only when there was a dominance of high-frequency energy and because vowels have a dominance of low frequency energy, none of the conditions tested differed significantly in overall vowel identification.

It is to be understood that the above-described embodiments are merely illustrative of the present invention and that many variations of the above-described embodiments can be devised by one skilled in the art without departing from the scope of the invention. It is therefore intended that all such variations be included within the invention and the scope of the following claims and their equivalents.

What is claimed is:

1. A sound processing device system configured to assist a hearing-impaired human listener recognize sounds, the sound processing device system comprising:
   a memory device system; and
   a data processing device system communicatively connected to the memory device system, the data processing device system configured by a program stored in the memory device system at least to:
   receive an input audio signal; and
   generate an output audio signal exhibiting a narrower bandwidth than the input audio signal at least by transposing and causing a negative rank ordering of frequency of at least a high-frequency portion of the input audio signal, the high-frequency portion of the input audio signal becoming a low-frequency portion of the output audio signal,
   wherein a maximum frequency of the narrower bandwidth of the output audio signal is lower than a maximum frequency in the input audio signal.

2. The sound processing device system of claim 1, wherein the low-frequency portion of the output audio signal represents an inverted ordering of frequencies present in the high-frequency portion of the input audio signal.

3. The sound processing device system of claim 1, wherein the negative rank ordering includes an inversion of an ordering of frequencies present in the at least the high-frequency portion of the input audio signal.

4. The sound processing device system of claim 1, further comprising:
   a sound receiving device system communicatively connected to the data processing device system and configured to receive sound and generate the input audio signal; and
   a sound producing device system communicatively connected to the data processing device system and configured to produce sound based upon the output audio signal.

5. The sound processing device system of claim 1, wherein the negative rank ordering includes frequency inverting and compressing the at least the high-frequency portion of the input audio signal.

6. The sound processing device system of claim 1, wherein the input audio signal is a first portion of an input audio signal stream, wherein the output audio signal is a first portion of an output audio signal stream, and wherein the data processing device system is configured by the program at least to:
   identify a speech pattern present in the first portion of the input audio signal stream;
   generate, in response to the speech pattern being identified as present in the first portion of the input audio signal stream, the first portion of the output audio signal stream at least by inverting a frequency relationship of at least part of the first portion of the input audio signal stream;
   identify that the speech pattern is not present in a second portion of the input audio signal stream that is other than the first portion of the input audio signal stream; and
   generate, in response to identifying that the speech pattern is not present in the second portion of the input audio signal stream, a second portion of the output audio signal stream without inverting a frequency relationship of at least part of the second portion of the input audio signal stream, the second portion of the output audio signal stream being other than the first portion of the output audio signal stream.

7. The sound processing device system of claim 6, wherein the data processing device system is configured by the program at least to:
   identify that the first portion of the input audio signal stream exhibits higher energy at a high-frequency range as compared to a mid-frequency range of the first portion of the input audio signal stream; and
   cause, by way of at least a gain, an attenuation, or both a gain and an attenuation, and in response to identifying that the first portion of the input audio signal stream exhibits the higher energy at the high-frequency range, a low-frequency range of the first portion of the output audio signal stream to be relatively emphasized or de-emphasized as compared to another frequency range of the first portion of the output audio signal stream or another time segment of the output audio signal stream to generate a perceptual cue to facilitate distinguishing of similar sounds, the low-frequency range of the first portion of the output audio signal stream corresponding, prior to the inverting the frequency relationship of the at least part of the first portion of the input audio signal stream, to the high-frequency range of the first portion of the input audio signal stream.

8. The sound processing device system of claim 6, wherein the speech pattern is frication.

9. The sound processing device system of claim 1, wherein the data processing device system is configured by the program at least to:
   determine whether or not the input audio signal exhibits higher energy at a high-frequency range than at a mid-frequency range of the input audio signal; and
   cause, by way of at least a gain, an attenuation, or both a gain and an attenuation, and in response to determining that the input audio signal exhibits the higher energy at the high-frequency range, a low-frequency range of the output audio signal to be relatively emphasized or de-emphasized as compared to another frequency range or another time segment of the output audio signal to generate a perceptual cue to facilitate distinguishing of similar sounds, the low-frequency range of the output audio signal corresponding, prior to the transposing and negative rank ordering of frequency of the at least the high-frequency portion of the input audio signal, to the high-frequency range of the input audio signal.

10. The sound processing device system of claim 1, wherein the data processing device system is configured by the program at least to:
determine whether or not the output audio signal exhibits higher energy at a low-frequency range than at a mid-frequency range of the output audio signal; and
cause, by way of at least a gain, an attenuation, or both a gain and an attenuation, and in response to determining that the output audio signal exhibits the higher energy at the low-frequency range, the low-frequency range of the output audio signal to be relatively emphasized or de-emphasized as compared to another frequency range or another time segment of the output audio signal to generate a perceptual cue to facilitate distinguishing of similar sounds, the low-frequency range of the output audio signal corresponding, prior to the transposing and negative rank ordering of frequency of the at least the high-frequency portion of the input audio signal, to a high-frequency range of the input audio signal.

11. A sound processing device system configured to assist a hearing-impaired human listener recognize sounds, the sound processing device system comprising:
a memory device system; and
a data processing device system communicatively connected to the memory device system, the data processing device system configured by a program stored in the memory device system at least to:
receive an input audio signal;
generate an output audio signal based at least upon a processing of the input audio signal, the processing of the input audio signal including transposing and causing a negative rank ordering of frequency of at least a high-frequency portion of the input audio signal, the high-frequency portion of the input audio signal becoming a low-frequency portion of the output audio signal; and
determine that (a) the input audio signal exhibits higher energy at a high-frequency range as compared to a mid-frequency range of the input audio signal, or (b) the output audio signal exhibits higher energy at a low-frequency range as compared to a mid-frequency range of the output audio signal,
wherein, in response to determining (a) or (b), the data processing device system is configured by the program at least to cause the output audio signal to include a perceptual cue at least by including an emphasis or a de-emphasis of the low-frequency range of the output audio signal as compared to another frequency range or another time segment of the output audio signal at least by an application of a gain, an attenuation, or both a gain and an attenuation, the perceptual cue being caused to be included regardless of frequency regions where hearing loss is occurring for the hearing-impaired human listener,
wherein, the generated output audio signal exhibits a narrower bandwidth than the input audio signal, and
wherein a maximum frequency of the narrower bandwidth of the output audio signal is lower than a maximum frequency in the input audio signal.

12. The sound processing device system of claim 11, further comprising:
a sound receiving device system communicatively connected to the data processing device system and configured to receive sound and generate the input audio signal; and
a sound producing device system communicatively connected to the data processing device system and configured to produce sound based upon the output audio signal.

13. The sound processing device system of claim 11, wherein the negative rank ordering includes an inversion of an ordering of frequencies present in the at least the high-frequency portion of the input audio signal.

14. The sound processing device system of claim 11, wherein the processing of the input audio signal includes frequency inverting and compressing the at least the high-frequency portion of the input audio signal.

15. The sound processing device system of claim 11, wherein the input audio signal is a first portion of an input audio signal stream, wherein the output audio signal is a first portion of an output audio signal stream, and wherein the data processing device system is configured by the program at least to:
identify a speech pattern present in the first portion of the input audio signal stream;
generate, in response to the speech pattern being identified as present in the first portion of the input audio signal stream, the first portion of the output audio signal stream at least by transposing and causing a negative rank ordering of frequency of at least part of the first portion of the input audio signal stream;
identify that the speech pattern is not present in a second portion of the input audio signal stream that is other than the first portion of the input audio signal stream; and
generate, in response to identifying that the speech pattern is not present in the second portion of the input audio signal stream, a second portion of the output audio signal stream without inverting a frequency relationship of at least part of the second portion of the input audio signal stream, the second portion of the output audio signal stream being other than the first portion of the output audio signal stream.

16. A hearing aid device comprising:
a sound receiving device system configured to receive sound and generate an input audio signal;
a sound producing device system configured to produce sound based upon an output audio signal;
a memory device system; and
a data processing device system communicatively connected to the memory device system, the sound receiving device system, and the sound producing device system, the data processing device system configured by a program stored in the memory device system at least to:
receive the input audio signal;
identify a speech pattern present in the input audio signal;
generate, in response to the speech pattern being identified as present in the input audio signal, the output audio signal at least by transposing and causing a negative rank scaling of frequency of at least a high-frequency portion of the input audio signal, the high-frequency portion of the input audio signal becoming a low-frequency portion of the output audio signal;

identify that the input audio signal exhibits higher energy at a high-frequency range as compared to a mid-frequency range of the input audio signal; and cause, by way of at least a gain, an attenuation, or both a gain and an attenuation, and in response to determining that the input audio signal exhibits the higher energy at the high-frequency range, a low-frequency range of the output audio signal to be relatively emphasized or de-emphasized as compared to another frequency range or another time segment of the output audio signal to generate a perceptual cue to facilitate distinguishing of similar sounds, the low-frequency range of the output audio signal corresponding, prior to the transposing and causing the negative rank scaling of frequency of the input audio signal, to the high-frequency range of the input audio signal, wherein, the generated output audio signal exhibits a narrower bandwidth than the input audio signal, and wherein a maximum frequency of the narrower bandwidth of the output audio signal is lower than a maximum frequency in the input audio signal.

\* \* \* \* \*